(12) United States Patent
Yu et al.

(10) Patent No.: US 8,012,827 B2
(45) Date of Patent: Sep. 6, 2011

(54) METHOD FOR FABRICATING A DUAL WORKFUNCTION SEMICONDUCTOR DEVICE AND THE DEVICE MADE THEREOF

(75) Inventors: HongYu Yu, Singapore (SG); Shou-Zen Chang, Hsinchu Country (TW); Thomas Y. Hoffmann, Leuven (BE); Philippe Absil, Loupoigne (BE)

(73) Assignee: IMEC, Leuven (BE)

( * ) Notice: Subject to any disclaimer, the term of this patent is extended or adjusted under 35 U.S.C. 154(b) by 210 days.

(21) Appl. No.: 12/428,341

(22) Filed: Apr. 22, 2009

(65) Prior Publication Data
US 2009/0283835 A1 Nov. 19, 2009

Related U.S. Application Data

(60) Provisional application No. 61/046,963, filed on Apr. 22, 2008.

(30) Foreign Application Priority Data

Jul. 11, 2008 (EP) ..................................... 08075618

(51) Int. Cl.
*H01L 27/092* (2006.01)
(52) U.S. Cl. ........ 438/258; 438/153; 438/154; 438/199; 438/E21.616
(58) Field of Classification Search .......... 438/153–154, 438/199, 258, E21.422
See application file for complete search history.

(56) References Cited

U.S. PATENT DOCUMENTS

| | | | |
|---|---|---|---|
| 6,794,234 B2 * | 9/2004 | Polishchuk et al. .......... | 438/199 |
| 2005/0045970 A1 | 3/2005 | Arikado et al. | |

OTHER PUBLICATIONS

European Search Report dated Dec. 1, 2009 for EP Application No. 08075618.
Samavedam, et al., Evaluation of candidate metals for dual-metal gate CMOS with HFO2 gate dielectric, Structure and Mechanical Behavior of Biological Materials, Materials Research Society Symposium Proceedings, vol. 716, Jan. 1, 2002.
Schaeffer et al., "Physical and electrical properties of metal gate electrodes on $HfO_2$ gate dielectrics", J. Vac. Sci. Technol. B, 21(1), p. 11-17 (Jan. 2003).
Triyoso, et al., Evaluation of lanthanum based gate dielectrics deposited by atomic layer deposition, Journal of Vaccum Science and Tehcnology, Part B, vol. 23, No. 1, Jan. 25, 2005.

* cited by examiner

*Primary Examiner* — Cuong Q Nguyen
*Assistant Examiner* — Trang Q Tran
(74) *Attorney, Agent, or Firm* — Knobbe Martens Olson & Bear LLP

(57) ABSTRACT

A method for manufacturing a dual workfunction semiconductor device and the device made thereof are disclosed. In one aspect, the method includes manufacturing a first transistor in a first region and a second transistor in a second region of a substrate, the first transistor including a first gate stack, the first gate stack having a first gate dielectric capping layer and a first metal gate electrode layer. The second gate stack is similar to the first gate stack. The method includes applying a first thermal budget to the first gate dielectric capping layer and a second thermal budget to the second gate dielectric capping material to tune the workfunction of the first and second gate stack, the first thermal budget being smaller than the second thermal budget such that after the thermal treatment the first and the second gate stack have different work functions.

17 Claims, 10 Drawing Sheets

US 8,012,827 B2

METHOD FOR FABRICATING A DUAL WORKFUNCTION SEMICONDUCTOR DEVICE AND THE DEVICE MADE THEREOF

CROSS REFERENCE TO RELATED APPLICATIONS

This application claims priority under 35 U.S.C. §119(e) to U.S. provisional patent application 61/046,963 filed on Apr. 22, 2008, which application is hereby incorporated by reference in its entirety.

BACKGROUND OF THE INVENTION

1. Field of the Invention

The present invention generally relates to methods for manufacturing semiconductor devices. More particularly, this invention relates to methods for manufacturing CMOS devices having a gate stack comprising a metal gate electrode and the CMOS devices made thereof.

2. Description of the Related Technology

Up to now, semiconductor industry remains driven by scaling geometric dimensions of metal-oxide-semiconductor field-effect-transistors (MOSFETs). With traditional MOSFET-technology, using silicon dioxide (SiO2) as gate dielectric and polycrystalline silicon (poly-Si) as gate material, a lot of problems occur when scaling down to 100 nm or below.

As the gate dielectric thickness is reduced, an exponential increase of gate direct tunneling currents occurs. One solution to solve this problem for a 45 nm technology node and beyond is the introduction of so-called high-k dielectrics as gate dielectric. A high-k dielectric is a dielectric featuring a dielectric constant (k) higher than the dielectric constant of SiO2, i.e. k>3.9. High-k dielectrics allow for a larger physical thickness (compared to SiO2) for obtaining a same effective capacitance than can be obtained with a much thinner SiO2 layer. The larger physical thickness of the high-k material will reduce gate leakage currents.

However, for SiO2 oxide thicknesses below 2 nm, a polysilicon (poly-Si) depletion effect starts to become dominant in the poly-Si gate. A solution to this problem is the introduction of metals as gate material. Advantages of metal gates are elimination of the polysilicon depletion effect, very low resistance, no dopant penetration possible and better compatibility with high-k gate dielectrics.

By introducing metal gates, the threshold voltage of the MOSFET becomes controlled by the metal workfunction. Regarding metal gate electrodes, tuning of the workfunction is not straightforward as a different workfunction is needed for NMOS than for PMOS. This requires now a (n-type) metal (replacing poly-Si) that works for nMOSFET (i.e. a workfunction preferably about 4.1 eV (+/− about 0.3 eV)) and a (p-type) metal that works for pMOSFET (i.e. a workfunction preferably about 5.2 eV (+/− about 0.3 eV)). Whereas the workfunction of a polysilicon gate electrode can be tuned by ion implantation, the workfunction of a metal gate electrode is a material property which cannot be changed easily.

The introduction of new gate materials, such as high-k gate dielectrics combined with metal gate electrodes, is not easy, since problems may occur in the traditional gate-first fabrication process like etch and strip. Also high thermal budgets in the gate-first integration scheme can form a problem, such as a shift in the threshold voltage and decreased device reliability. To overcome these high-thermal budgets, a low-temperature process has been introduced, commonly known as the gate-last approach or replacement-gate (RPG) approach. In the gate-last approach the metal gate deposition occurs after the source/drain activation anneals, such that the metal material is not exposed to high temperatures.

Hence, for the integration of high-k gate dielectrics and metal gate electrodes in a complementary metal-oxide-semiconductor (CMOS) device, new alternatives have to be introduced in the process flow. Although already some possibilities are available in the state-of-the-art for the integration of metal gate and high-k dielectric in CMOS devices, there is a need for simplified integration schemes for high-k/metal semiconductor device and more specific for simplified single metal, single dielectric (SMSD) integration schemes and metal/high-k RPG integration schemes.

SUMMARY OF CERTAIN INVENTIVE ASPECTS

One inventive aspect relates to a method for manufacturing a dual workfunction semiconductor device comprising providing a semiconductor substrate (200) with a first region (201) and a second region (202); manufacturing a first transistor (207) in the first region (201); the first transistor (207) comprising a first gate stack (231) having a first effective workfunction ($WF1_{eff}$), the first gate stack (231) further comprising a first gate dielectric capping layer (214a) and a first metal gate electrode layer (215a) on and in contact with the first gate dielectric capping layer (214a), the first gate dielectric capping layer (214a) determining the first effective workfunction ($WF1_{eff}$). The method according to one aspect further comprises manufacturing a second transistor (208) in the second region (202); the second transistor (208) further comprising a second gate stack (232) having a second effective workfunction ($WF2_{eff}$), the second gate stack (232) comprising a second gate dielectric capping layer (214b) and a second metal gate electrode layer (215b) on and in contact with the second gate dielectric capping layer (214b), the second metal gate electrode layer (215b) consisting of the same metal composition as the first metal gate electrode layer (214a). The second gate dielectric capping layer (214b) comprises the same dielectric material as the first dielectric capping layer (214a), the second gate dielectric capping layer (214b) determining the second effective work function ($WF2_{eff}$), and the second effective work function ($WF2_{eff}$) being the same as the first effective workfunction ($WF1_{eff}$). The method according to one aspect further comprises applying a first thermal budget to at least the first gate dielectric capping layer (214a) and a second thermal budget to at least the second gate dielectric capping material (214b), the first thermal budget being smaller than the second thermal budget such that the first effective workfunction ($WF1_{eff}$) is modified into a final first effective workfunction ($WF1_{eff-final}$) and such that the second effective workfunction ($WF2_{eff}$) is modified into a final second effective workfunction ($WF2_{eff-final}$), wherein the final first effective workfunction ($WF1_{eff-final}$) is different from the final second effective work function ($WF2_{eff-final}$).

It is an advantage of certain inventive aspects that a dual workfunction semiconductor device may be manufactured using one single metal gate electrode material and one single dielectric capping layer material.

The first gate dielectric capping layer is selected to have essentially no influence on the first effective work function ($WF1_{eff}$) of the first gate stack after applying the first thermal budget.

According to an embodiment of the present invention, $$\frac{(WF1_{\mathit{eff-final}} - WF1_{\mathit{eff}})}{(WF2_{\mathit{eff-final}} - WF2_{\mathit{eff}})} \leq \text{about } 0.1$$

with $WF1_{\mathit{eff}}$ being the first effective workfunction, $WF2_{\mathit{eff}}$ being the second effective workfunction $WF1_{\mathit{eff-final}}$ being the final first effective workfunction, $WF2_{\mathit{eff-final}}$ being the final second effective workfunction. The final first effective workfunction ($WF1_{\mathit{eff-final}}$) may be equal to the first effective work function ($WF1_{\mathit{eff}}$).

According to another embodiment of the present invention one of the first or the second transistor is a PMOS transistor and the other one of the first or the second transistor is a NMOS transistor. If the first transistor is a PMOS transistor, the second transistor is advantageously a NMOS transistor or vice versa.

According to another embodiment of the present invention the manufacturing of the first transistor may be done using a gate-last approach. The manufacturing of the second transistor may be done using a gate-last approach or a gate-first approach.

According to another embodiment of the present invention the first thermal budget is at a temperature lower than 800 degrees Celsius According to another embodiment of the present invention the manufacturing of the first transistor further comprises forming a first dummy gate stack in the first region, the first dummy gate stack comprising a polysilicon gate electrode layer on and in contact with a first gate dielectric host layer; forming a source/drain region; removing the polysilicon gate electrode thereby exposing the underlying first gate dielectric host layer; forming the first gate dielectric capping layer on and in contact with the first gate dielectric host layer; forming the first metal gate electrode layer overlying the first gate dielectric capping layer.

According to another embodiment of the present invention the manufacturing of the second transistor is done using a gate-last approach. Using the gate-last approach, the manufacturing of the second transistor further comprises: forming a second dummy gate stack in the second region, the second dummy gate stack comprising a polysilicon gate electrode layer overlying a second gate dielectric host material; forming a source/drain region; removing the polysilicon gate electrode thereby exposing the underlying second gate dielectric host layer; forming the second gate dielectric capping layer on and in contact with the second gate dielectric host layer; forming the second metal gate electrode layer on and in contact with the second gate dielectric capping layer;

According to an embodiment of the present invention, the process of applying a first thermal budget to the first gate dielectric capping layer and a second thermal budget to the second gate dielectric capping layer further comprises: providing a heat sensitive layer on the first region after the process of forming the second metal gate electrode layer; performing a thermal annealing process of the first region and the second region simultaneously, such that the heat sensitive layer blocks at least part of the temperature resulting in a first thermal budget being smaller than the second thermal budget; removing the heat sensitive layer.

The heat sensitive layer may be a heat reflection layer or a heat absorption layer. For a heat reflection layer, the heat sensitive layer may comprise aluminum.

According to an embodiment of the present invention the thermal annealing process comprises a laser anneal.

The first dielectric capping layer and the second dielectric capping layer may comprise a lanthanide-based dielectric material or an aluminum-based dielectric material.

One of the first or the second transistor is a PMOS transistor, while the other one of the first or the second transistor is a NMOS transistor.

It is an advantage of certain embodiments that a dual workfunction semiconductor device may be formed comprising an NMOS and PMOS transistor comprising the same materials for the gate stack, i.e. comprising the same metal gate electrode material and the same dielectric capping layer material.

BRIEF DESCRIPTION OF THE FIGURES

All drawings are intended to illustrate some aspects and embodiments of the present invention. The drawings described are only schematic and are non-limiting. In the drawings, the size of some of the elements may be exaggerated and not drawn on scale for illustrative purposes.

Exemplary embodiments are illustrated in referenced figures of the drawings. It is intended that the embodiments and figures disclosed herein be considered illustrative rather than restrictive. In the different figures, the same reference signs refer to the same or analogous elements.

DETAILED DESCRIPTION OF CERTAIN ILLUSTRATIVE EMBODIMENTS

Figure 1A:
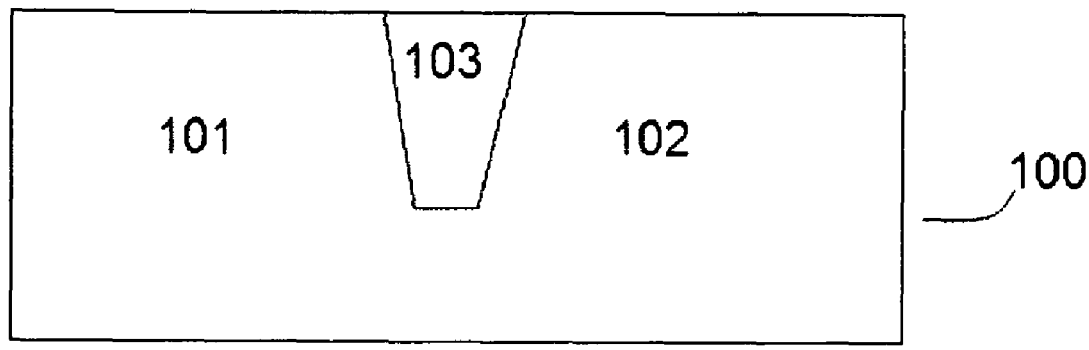
FIGS. 1A-1H show a schematic representation of different process steps for manufacturing a dual workfunction semiconductor device according to gate-last/gate-last approach as described in certain embodiments of the invention.

One or more embodiments of the present invention will now be described in detail with reference to the attached figures; the invention is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention. Those skilled in the art can recognize numerous variations and modifications of this invention that are encompassed by its scope. Accordingly, the description of preferred embodiments should not be deemed to limit the scope of the present invention.

Furthermore, the terms first, second and the like in the description are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description are used for descriptive purposes and not necessarily for describing relative positions. The terms so used are interchangeable under appropriate circumstances and the embodiments of the invention described herein can operate in other orientations than described or illustrated herein. For example "underneath" and "above" an element indicates being located at opposite sides of this element.

Reference throughout this specification to "one embodiment" or "an embodiment" means that a particular feature, structure or characteristic described in connection with the embodiment is included in at least one embodiment of the present invention. Inventive aspects may lie in less than all features of a single foregoing disclosed embodiment.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range of about plus/minus 20% are comprised relative to the value of each subscript. Such varied values do not necessarily sum to a whole number and this departure is contemplated. Such variations may occur due to either intended selection and control of the process conditions, or due to unintended process variations.

The following terms are provided solely to aid in the understanding of the description.

Various embodiments of the invention are referring to parameters of the semiconductor device such as threshold voltage (Vt), effective work function ($WF_{eff}$), or physical characteristics of the material(s) employed such as work function (WF), Fermi level etc. The definitions as used through this document are summarized herein below.

In the MOSFET device, the gate requires a threshold voltage (Vt) to render the channel conductive. Complementary MOS (CMOS) processes fabricate both n-channel and p-channel (respectively NMOS and PMOS) transistors. The threshold voltage Vt is influenced by what is called the effective work function difference ($\Delta WF_{eff}$). To establish threshold voltage (Vt) values, the effective work function differences of the respective PMOS and NMOS gate materials (gate stacks) and their corresponding channel regions are independently established through channel processing and gate processing. In other words, both gate dielectric (consisting i.e. of a host dielectric and possible different capping layers) and gate electrode (consisting i.e. of at least one metal layer) determine the effective work function of the gate stack (device) ($WF_{eff}$). Moreover, the gate processing itself (i.e. the sequence of the different processes and/or the thermal treatments applied) may have an influence on the effective work function of the gate stack (device) ($WF_{eff}$).

The effective work function of a gate stack (device) ($WF_{eff}$) is a parameter that can be tuned (adjusted/modified) by the choice of the gate dielectric materials, gate electrode materials and by the gate processing performed. On the contrary, the work function (WF) of the gate electrode (often referred to as metal gate electrode or metal layer or metal control electrode) is an intrinsic property of the material. In general, the work function of a certain material (i.e. a metal layer) is a measure of the energy, in electron volts (eV), required to eject an electron in the material outside of a material atom to the vacuum, if the electron were initially at the Fermi level. The work function of the gate electrode may also be referred to as as-deposited workfunction or the intrinsic workfunction of the material.

For a silicon substrate, the gate electrode of a negative channel MOSFET (or NMOS) device would have an n-type work function of approximately 4.1 eV (+/− about 0.3 eV), and the gate electrode of a positive channel MOSFET (or PMOS) device would have a p-type work function of approximately 5.2 eV (+/−about 0.3 eV).

A high-k dielectric is a dielectric featuring a dielectric constant (k) higher than the dielectric constant of SiO2, i.e. k>3.9. High-k dielectrics allow for a larger physical thickness (compared to SiO2) for obtaining a same effective capacitance than can be obtained with a much thinner SiO2 layer.

In the following certain embodiments of the present invention will be described with reference to a silicon (Si) substrate but it should be understood that these embodiments apply equally well to other semiconductor substrates. In embodiments, the "substrate" may include a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

In a first aspect of the present invention a method for manufacturing a dual work function semiconductor device is disclosed, the method comprising providing a substrate with a first region 101 and a second region 102, manufacturing a first semiconductor transistor 107 in the first region 101, the first semiconductor transistor 107 comprising a first gate stack 131 having a first effective work function ($WF1_{eff}$), the first gate stack 131 comprising a first gate dielectric capping material 114a and a first metal gate electrode material 115a on and in contact with the first gate dielectric capping material 114a, the first gate dielectric capping material 114a determining the first effective workfunction ($WF1_{eff}$). The method further comprises manufacturing a second semiconductor transistor 108 in the second region 102, the second semiconductor transistor 108 comprising a second gate stack 132 having a second effective workfunction ($WF2_{eff}$), the second gate stack 132 comprising a second gate dielectric capping material 114b and a second metal gate electrode material 115b on and in contact with the second gate dielectric capping material 114b, the second metal gate electrode layer 115b consisting of the same metal composition as the first metal gate electrode layer 115a, the second gate dielectric capping material 114b being the same as the first dielectric capping material 114a, the second gate dielectric capping material 114b determining the second effective work function ($WF2_{eff}$). A first thermal budget is applied to the first gate dielectric capping material 114a and a second thermal budget to the second gate dielectric capping material 114b, the first thermal budget being lower than the second thermal budget such that the first thermal budget and the first gate dielectric capping layer 114a determine a final first effective workfunction ($WF1_{eff\text{-}final}$), the final first effective workfunction ($WF1_{eff\text{-}final}$) being different from the first effective workfunction ($WF1_{eff}$) and that the second thermal budget and the second gate dielectric capping layer 114b determine a final second effective workfunction ($WF2_{eff\text{-}final}$), the final second effective workfunction ($WF2_{eff\text{-}final}$) being different from the second effective workfunction ($WF2_{eff}$), whereby the final first effective workfunction ($WF1_{eff\text{-}final}$) is different from the final second effective work function ($WF2_{eff\text{-}final}$).

The process of manufacturing the first semiconductor transistor and the second semiconductor transistor may be done according to different embodiments of the present invention. The process of manufacturing the first semiconductor transistor is preferably done using a gate-last approach. In a gate-last approach, also often referred to as replacement-gate (RPG) approach, the metal gate deposition occurs after the activation anneals (i.e. junction activation, source/drain activation) and silicidation. In a gate-first approach the metal gate is deposited on a high-k gate dielectric prior to the activation anneals, such that the metal gate is exposed to high temperatures (temperatures up to about 1100 degrees Celsius or higher), which could be detrimental for the proper working of the device. In a gate-last approach, the metal of the metal gate is thus not exposed to these high temperatures. The process of manufacturing the second semiconductor transistor may be done according embodiments of the present invention using a gate-first approach. Alternatively, the process of manufacturing the second semiconductor transistor may be done according embodiments of the present invention using a gate-last approach (also known as replacement-gate or RPG approach).

With reference now to FIG. 1A to FIG. 1H different process steps for a method for manufacturing a dual workfunction semiconductor device according to certain embodiments of the present invention is described in more detail wherein a gate-last approach is used for manufacturing the first semiconductor transistor and wherein a gate-last approach is used for manufacturing the second semiconductor transistor. In the following description of the different process steps related to any of FIG. 1A to FIG. 1H, there may also be referred to process steps of a gate-last/gate-last (GL/GL) approach. Several processes steps for manufacturing the first semiconductor transistor and for manufacturing the second semiconductor transistor in this GL/GL approach may be performed simultaneously.

FIG. 1A illustrates a semiconductor substrate 100, e.g. a silicon substrate. The substrate 100 may comprise multiple distinct regions. Most preferably two distinct regions may be defined in the substrate 100, as is illustrated in FIG. 1A: a first region 101 and a second region 102. The first region 101 may also be referred as the first active region of the device and the second region 102 may also be referred as the second active region of the device. The first region 101 and the second region 102 may be electrically isolated from each other by an insulating region 103. A possible way to isolate the first 101 and second 102 region from each other is by using shallow trench isolation (STI) in between. STI is a deep narrow trench, filled with oxide, etched into the semiconductor substrate in between adjacent devices in an integrated circuit to provide electrical isolation between. Alternatively, local oxidation of silicon (LOCOS) may be used.

The first transistor will be formed in the first region 101, the first transistor being for example a PMOS transistor (and thus the first region 101 representing a PMOS region for forming a PMOS transistor). The second transistor will be formed in the second region 102, the second transistor begin for example a NMOS transistor (and thus the second region 102 representing a NMOS region for forming a NMOS transistor). It should be understood that the invention is not limited thereto and NMOS and PMOS may be interchanged, i.e., forming a first NMOS transistor in the first (NMOS) region and a second PMOS transistor in the second (PMOS) region.

Figure 1B:
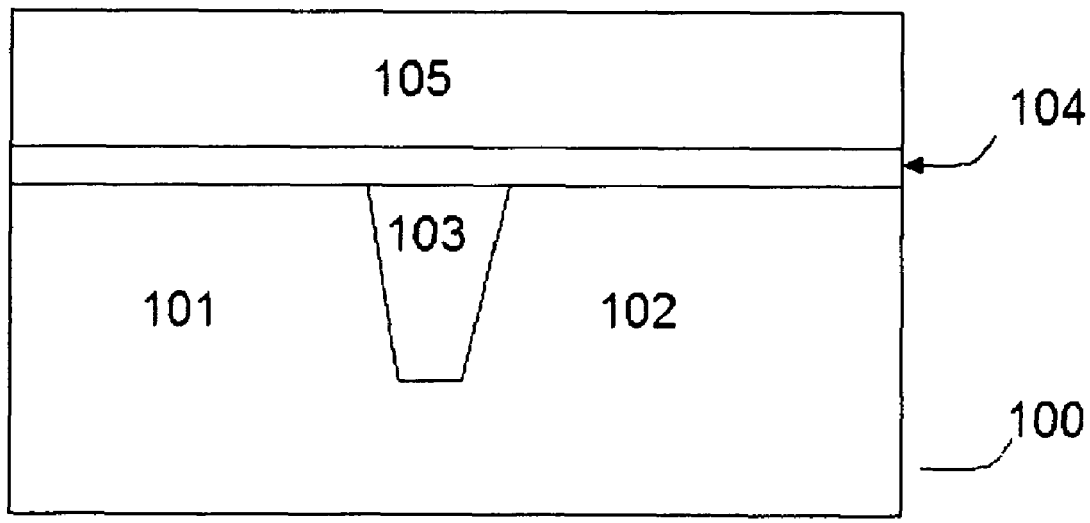

After providing a first region 101 and a second region 102 a gate dielectric host layer 104 is provided on the substrate (FIG. 1B). The gate dielectric host layer 104 may be provided in both the first region 101 and second region 102. The dielectric layer 104 may be a layer of insulating material, such as for example silicon dioxide ($SiO_2$), silicon nitride (SiN) or silicon oxynitride ($Si_xO_yN_{1-x-y}$) or more preferably any high-k dielectric material (i.e. k>3.9) such as for example $HfO_2$, $TaO_x$, $Al_2O_y$, or any combination made thereof. The gate dielectric host layer 104 may be formed by thermal oxidation, atomic layer deposition (ALD) or chemical vapor deposition (CVD) or physical vapor deposition (PVD), or any other suitable method known to a person skilled in the art. The gate dielectric host layer 104 may comprise a stack of dielectric materials, such as for example a high-k material (e.g. $HfO_2$) formed on top of an (optional) interfacial dielectric layer (e.g. $SiO_2$—not shown) between the substrate 100 and high-k material. In one embodiment, the gate dielectric host layer 104 may have a thickness in the range of about 0.5 nm to 4 nm.

In the GL/GL approach (FIG. 1B), after providing the gate dielectric host layer 104 a dummy gate electrode layer 105 is provided on the gate dielectric host layer 104. The dummy gate electrode layer 105 preferably comprises polysilicon. In a further process the patterned dummy gate electrode layer 105 will be removed (FIG. 1E). The removal of the patterned dummy polysilicon gate electrode may be done for example by using a wet etch process or other etch process known by a person skilled in the art.

Figure 1C:
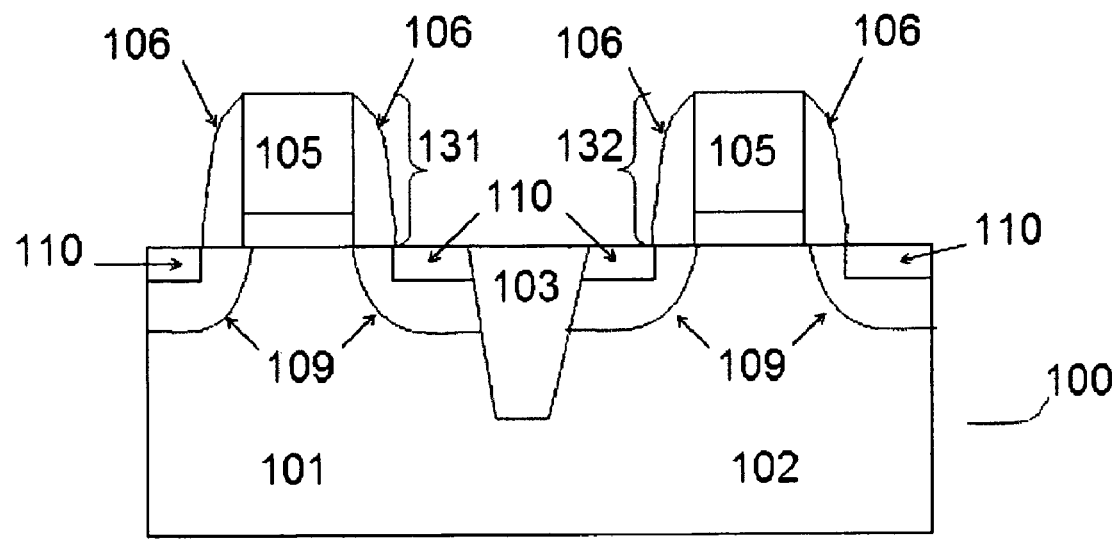

Conventional process steps, materials and equipment may be used to generate a device as illustrated in FIG. 1C, i.e. process steps comprising patterning (e.g. using conventional lithography) the gate host dielectric layer 104 and the dummy gate electrode layer 105 to form a first dummy gate stack 131 in the first region 101 and a second dummy gate stack 132 in the second region 102, providing spacers 106 aside of the first and second dummy gate stack 131, 132, activation of the source/drain regions (extension regions/junction regions) 109 in the first region 101 and in the second region 102 and additional silicidation 110. For the activation of the source/drain regions 109 and as well for the formation of the silicided regions 110 in the source/drain regions 109 an annealing process is necessary. This annealing process comprises a high temperature process. This is a high thermal budget process. The temperature of the annealing process is typically higher than about 500 degrees Celsius, preferably higher than about 800 degrees Celsius, more preferably in the range of about 800 degrees Celsius to 1200 degrees Celsius. Spike annealing or rapid thermal annealing (RTA) may be used.

The spacers 106 preferably comprise an insulating material such as for example silicon dioxide ($SiO_2$), silicon nitride (SiN) or silicon oxynitride (SiON). Spacers may be deposited by ALD or CVD and patterned by anisotropic etching, or any other suitable method known to a person skilled in the art.

Figure 1D:
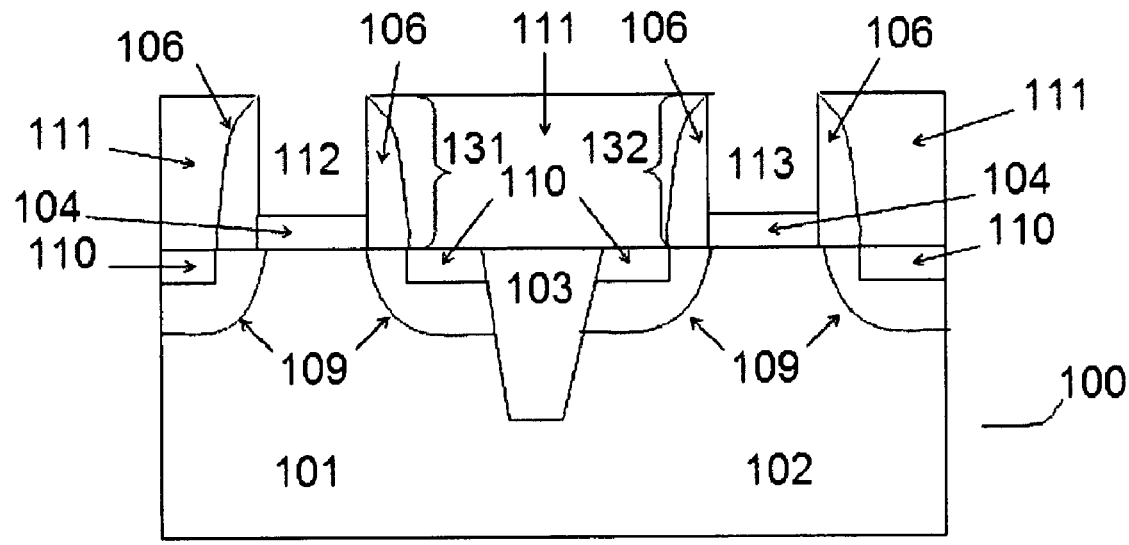
Figure 1E:
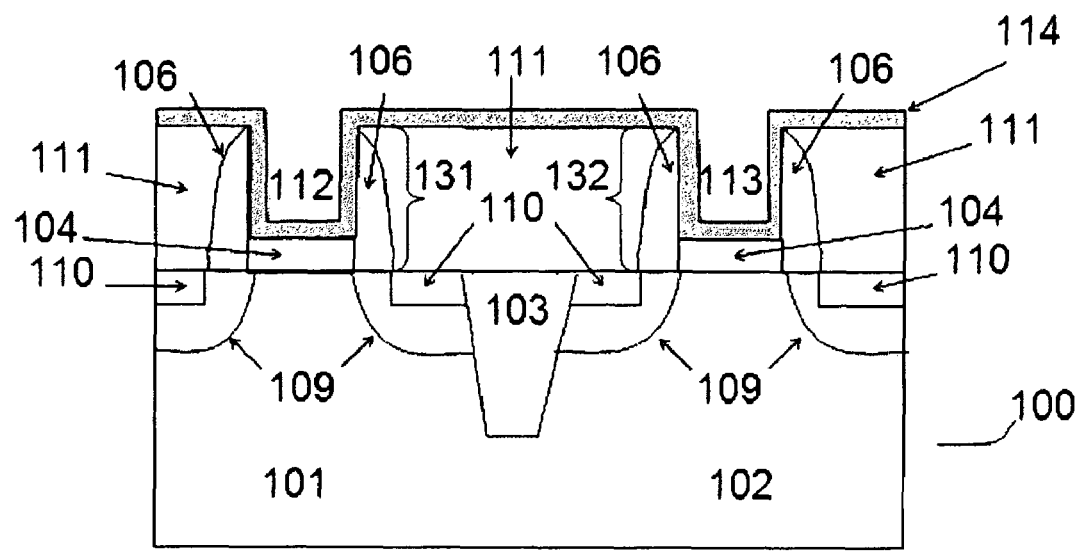

In a following process, the dummy gate electrode material 105 in the first gate stack 131 and the second gate stack 132 is removed (FIG. 1D). After removing the dummy gate electrode material 105, e.g. the polysilicon gate electrode material, the underlying gate dielectric host layer 104 is exposed in the first region 101 and the second region 102. The removal of the dummy gate electrode material 105 may be done using an etching process which is selective towards the underlying gate dielectric host material 104. More specifically first a dielectric layer 111 may be formed. The formation of the dielectric layer 111 may be done for example by depositing the dielectric layer 111 using CVD, followed by polishing back (e.g. using CMP) the dielectric layer 111 to expose the dummy gate electrode material 105 in both the first region 101 and second region 102. The dielectric layer 111 forms a protective layer for protecting the underlying source/drain regions 109 and silicide regions 110 and spacers 106 during the subsequent etching process for removing the dummy gate electrode material 105. Alternatively (not shown) a protective dielectric liner may be formed on the source/drain regions 109 and silicide regions 110 and aside of the spacers 106. Using a CMP-less hardmask opening process, the dummy gate electrode material 105 may be removed. After removing the dummy gate electrode material 105 a first trench 112 in the first region 101 and a second trench 113 in the second region 102 is formed in between the sidewall spacers 106. After removal of the dummy gate electrode material 105, the gate dielectric host layer 104 is still present in the first gate stack 131 and in the second gate stack 132. The dummy gate electrode material 105 however is not present anymore in the first gate stack 131 and in the second gate stack 132.

The process of removing the dummy gate electrode material after the source/drain activation, the source/drain silicidation is well known in the so-called gate-last approach or also often referred to replacement gate approach (RPG). The gate-last approach is, to the contrary of a conventional gate-first approach, considered a low-temperature process because the metal gate deposition occurs after the activation anneals (i.e. source/drain activation) and silicidation. In a gate-first approach the metal gate is deposited on a high-k gate dielectric prior to the activation anneals, such that the metal gate is exposed to high temperatures (temperatures up to 1100 degrees Celsius or higher), which could be detrimental for the proper working of the device. In a gate-last approach, the metal of the metal gate (which will be provided in a further process after removing the dummy gate electrode material) is thus not exposed to these high temperatures. It is known from the state of the art, such as for example published by Schaeffer et al., J. Vac. Sci. Technol. B, 21(1), p. 11-17 (2003) on the "Physical and electrical properties of metal gate electrodes on $HfO_2$ gate dielectrics", that a shift of the threshold voltage ($V_t$) may occur when the gate stack (high-k gate dielectric and metal gate) is subjected to a high thermal budget (such as for example junction activation, source/drain activation, silicidation) as typically done in a gate-first approach.

After removal of the dummy gate electrode layer 105 a dielectric capping layer 114 is formed (FIG. 1E), the dielectric capping layer 114 overlying (on and in contact with) the gate dielectric host layer 104 in the first gat stack 131 and in the second gate stack 132.

The dielectric capping material 114 may comprise any dielectric material suitable for tuning the effective workfunction of a gate stack, i.e. for determining the effective workfunction of the first gate stack 131 and for determining the effective workfunction of the second gate stack 132. The dielectric capping layer 114 may comprise an aluminum-based dielectric or a lanthanide-based dielectric. The dielectric capping layer 114 may comprise LaO(N), AlO(N), AlN, DyO(N), ScO(N), GdO(N), CeO(N), TbO(N), ErO(N), YbO(N) or any combination thereof. Depending on the material of the dielectric capping material 114, this dielectric capping layer 114 may be suitable for tuning the first effective workfunction of the first gate stack of the first transistor towards an NMOS device or towards a PMOS device and for tuning the second effective workfunction of the second gate stack of the second transistor towards a PMOS device or towards a NMOS device respectively. If the dielectric capping layer 114 comprises a material with more electropositive atoms (compared to the gate dielectric host layer) such that the built-in dipole field in the gate dielectric (i.e. stack of gate dielectric host layer 104 and dielectric capping layer 114—e.g. HfSiON—DyO stack) may adapt the threshold voltage of the NMOS device independently of the workfunction of the metal gate (e.g. TiN). The DyO layer will thus determine the effective workfunction, which is suitable for an NMOS transistor. If the dielectric capping layer 114 comprises a material with more electronegative atoms (compared to the gate dielectric host layer) such that the built-in dipole field in the dielectric (e.g. HfSiON—AlO stack) may adapt the threshold voltage of the PMOS device independently of the workfunction of the metal gate (e.g. TiN). The AlO layer will thus determine the effective workfunction, which is suitable for a PMOS transistor.

The dielectric capping layer 114 preferably has an equivalent oxide thickness (EOT) in the range of about 0.2 nm to 2 nm more preferably in the range of about 0.2 nm to 1 nm and even more preferably in the range of about 0.2 nm to 0.5 nm.

The dielectric capping layer 114 is formed by using any suitable deposition technique such as ALD, PVD, CVD. Preferably a conformal dielectric capping layer 114 is formed. Part of the dielectric capping layer may be removed such that the dielectric capping layer is only present on the dielectric layer 104 and at the sidewalls of the trenches 112, 113 aside of the spacers 106. The dielectric capping layer overlying part of the dielectric layer 111 may be removed by an etching process as commonly known for a person skilled in the art (FIG. 1G). The dielectric capping layer 114 in the first gate stack 131 is further referred to as first dielectric capping layer 114a and the dielectric capping layer in the second gate stack 132 is further referred to as second dielectric capping layer 114b.

Figure 1F:
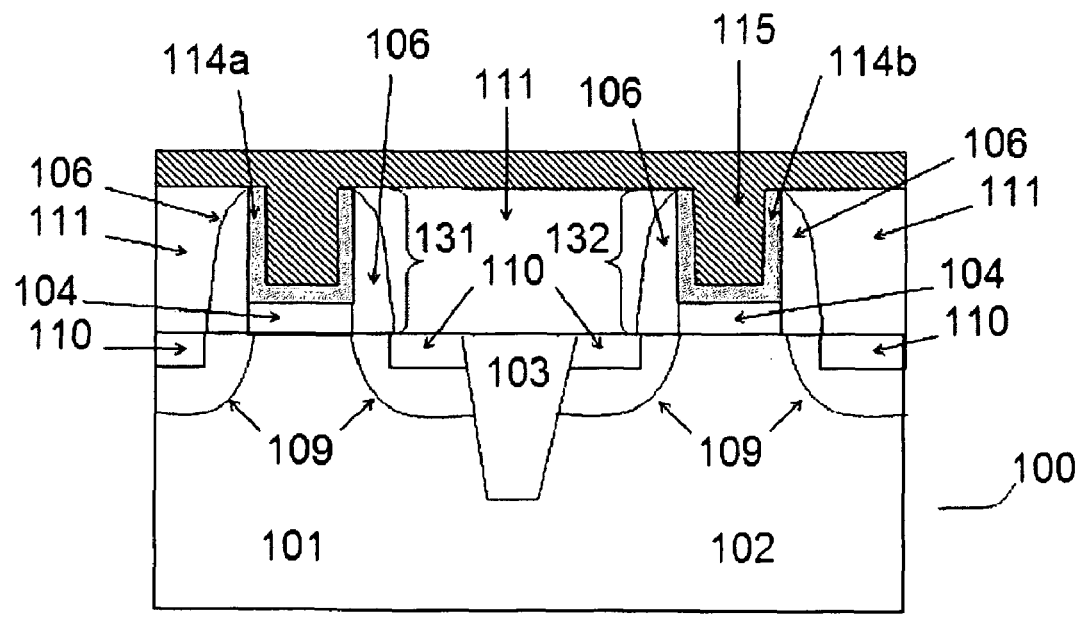
Figure 1G:
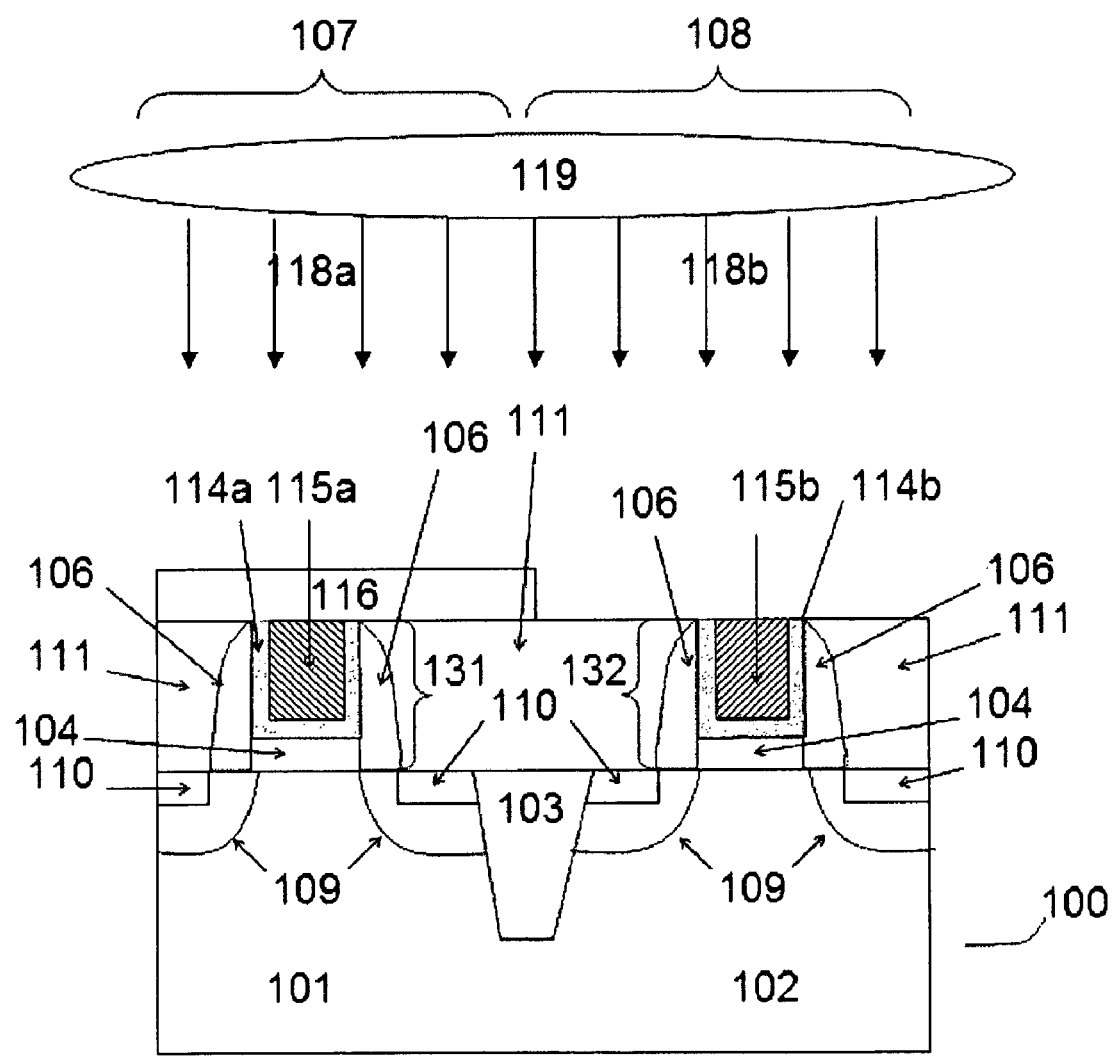

After the formation of the first and second dielectric capping layer 114a, 114b, a metal gate electrode 115 is formed in the first trench 112 and in the second trench 113 (FIG. 1F). The metal gate electrode material 115 may be deposited over the whole device (i.e. over the dielectric layer 111 and over the dielectric capping layer 114) using a conventional metal deposition technique such as for example ALD, CVD, PVD. The metal gate electrode material 115 is preferably present in the complete trench 112 and 113. The first trench 112 and second trench 113 are preferably completely filled with the metal gate electrode material 115. The metal gate electrode material in the first gate stack 131 is further referred to as first metal gate electrode material 115a and the metal gate electrode material in the second gate stack 132 is further referred to as second metal gate electrode material 115b (FIG. 1G). The first metal gate electrode 115a and the second metal gate electrode 115b thus comprise the same metal (metal material composition).

The first and second metal gate electrode 115a, 115b comprises a metal comprising material to form a metal gate, the metal having a (as-deposited) workfunction. With metal comprising material is understood metals, metal alloys, metal silicides, conductive metal nitrides, conductive metal oxides, . . . . Depending on the metal, the workfunction WF of the metal gate electrode may be similar to the workfunction of a conventional p-type doped semiconductor or to the workfunction of a conventional n-type doped semiconductor. For example nickel (Ni), ruthenium oxide (RuO), and molybdenum nitride (MoN) have a workfunction similar to a p-type doped semiconductor material. For example ruthenium (Ru), zirconium (Zr), niobium (Nb), tantalum (Ta), titanium silicide ($TiSi_2$) have a workfunction similar to a n-type doped semiconductor material. For example TiN has is a midgap workfunction i.e. in between the workfunction for n-type doped and p-type doped semiconductor material (for TiN on SiO$_2$, ~4.65 eV-4.8 eV).

For example a metal gate electrode material 115 may be formed having a (as-deposited) workfunction which is suitable for forming a NMOS gate electrode in the first region 101 (first transistor), but which is not suitable for forming a PMOS gate electrode in the second region 102 (second transistor). Or vice versa a metal gate electrode material 115 may be formed having a (as-deposited) workfunction which is suitable for forming a PMOS gate electrode in the first region 101, but which is not suitable for forming a NMOS gate electrode in the second region 102. For the formation of a dual workfunction semiconductor device using one metal gate electrode material for both regions (NMOS and PMOS transistor), the workfunction of the metal gate electrode material 115 needs to be tuned selectively, i.e. the workfunction of the metal gate electrode material 115 needs to be tuned in that region for which its (as-deposited) workfunction is not suitable.

With suitable for forming a NMOS gate electrode is meant that the workfunction may be approximately 4.1 eV (+/− about 0.3 eV). Or vice versa a metal gate electrode material 115 may be formed having a (as-deposited) workfunction which is suitable for forming a PMOS gate electrode in the first region 101, but which is not suitable for forming a NMOS gate electrode in the second region 102. With suitable for forming a PMOS gate electrode is meant that the workfunction may be approximately 5.2 eV (+/− about 0.3 eV). For the formation of a dual workfunction semiconductor device using one metal gate electrode material for both regions (NMOS and PMOS), the workfunction of the metal gate electrode material 115 needs to be tuned selectively, i.e. the workfunction of the metal gate electrode material 115 needs to be tuned in that region for which its (as-deposited) workfunction is not suitable.

The dielectric capping layer 114a, 114b will further determine the effective workfunction of the first and the second gate stack 131, 132. Otherwise the dielectric capping layer 114a located under the metal gate electrode material 115a in the first gate stack 131 determines a first effective workfunction WF1$_{eff}$ of the first gate stack 131 and the dielectric capping layer 114b located under the metal gate electrode material 115b in the second gate stack 132 determines a second effective workfunction WF2$_{eff}$ of the second gate stack 132.

At this point in the process flow of formation of the first semiconductor transistor and the second semiconductor transistor, both the first gate stack 131 and second gate stack 132 have not been subjected to any high thermal budget process (i.e. to any high temperature process), i.e. a temperature process higher than 800 degrees Celsius. At this moment in the process flow (i.e. after the formation of the first and second dielectric capping layer 114a, 114b, but before the following process of applying a first and second thermal budget) the first effective workfunction WF1$_{eff}$ of the first gate stack 131 and the second effective workfunction WF2$_{eff}$ of the second gate stack 132 are the same, i.e. have the same value. So far the first gate stack 131 and the second gate stack 132 underwent the same process. Otherwise the at this moment in the process flow, there is no difference between the first effective workfunction WF1$_{eff}$ and the second effective workfunction WF2$_{eff}$. At this point the first effective workfunction WF1$_{eff}$ of the first gate stack 131 may for example be suitable for NMOS (or PMOS), whereas the second effective workfunction WF2$_{eff}$ of the second gate stack 131 is not suitable for PMOS (or NMOS respectively). It is thus necessary to apply another process for further tuning the effective workfunction of one of the two gate stacks; more specifically further tuning the effective workfunction of the gate stack for which the effective workfunction after metal gate formation is not suitable.

Figure 3:
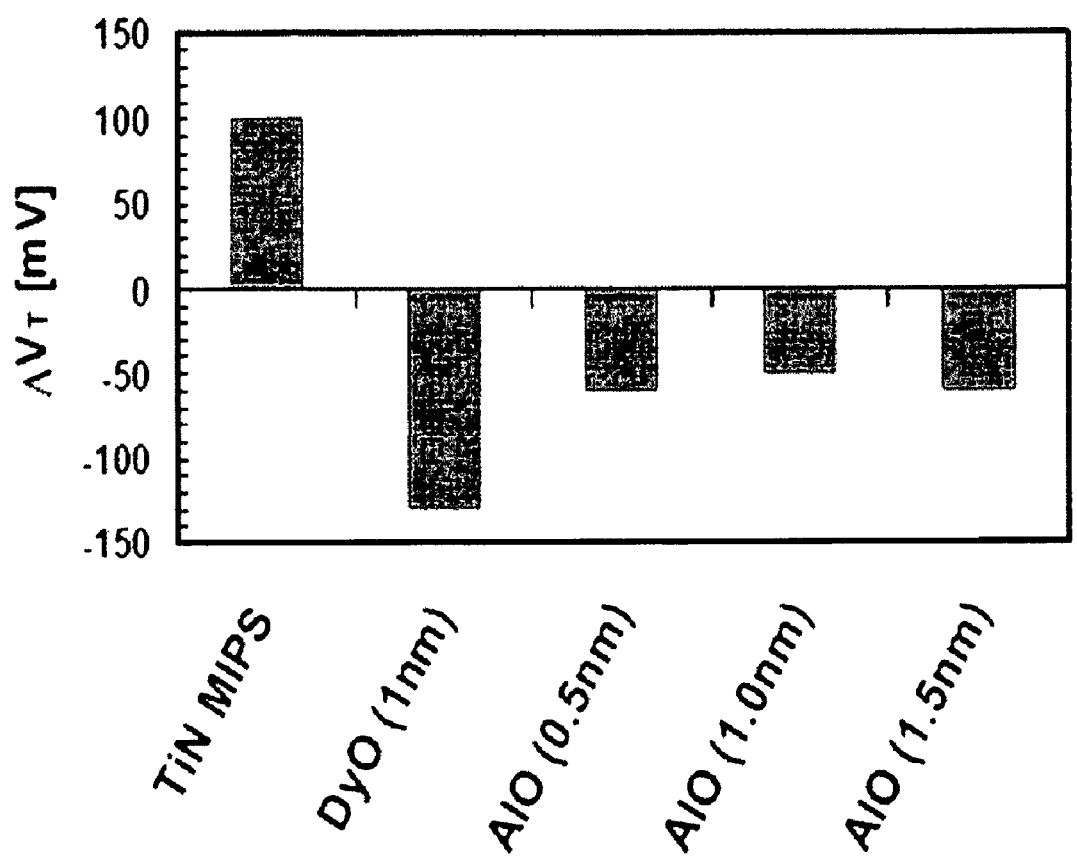
FIG. 3 shows experimental data of the $V_t$ shift for different capping dielectric materials with a TiN metal gate using a gate-last approach according to certain embodiments of the present invention.

The gate dielectric host layer 104 may comprise for example HfSiON. For example the first and second dielectric capping layer 114a, 114b may comprise a dielectric comprising more electropositive atoms (than the gate dielectric host layer) such as for example DyO. The first and second gate electrode material 115a, 115b may comprise a mid-gap metal material such as for example TiN. DyO is know to be a dielectric with more electropositive atoms such that the built-in dipole field in the dielectric (i.e. HfSiON—DyO stack) may adapt the threshold voltage of the NMOS device independently of the workfunction of the metal gate (TiN). The DyO layer will thus determine the effective workfunction, which is suitable for an NMOS transistor. Surprisingly it was seen from experiments that DyO may also tune the effective workfunction towards a value close to the valence band, i.e. towards an effective workfunction which is suitable for a PMOS transistor (FIG. 3). It was seen that in a gate-last approach (i.e. formation of the metal gate electrode after the high thermal budget for junction activation, source/drain activation and/or silicidation) a DyO capping layer of about 1 nm results in a (negative) shift of the threshold voltage Vt of about 130 mV towards P-type (i.e. a shift of the effective workfunction towards the valence band), which is an opposite shift of the threshold voltage when using DyO capping layer in a conventional gate-first approach (i.e formation of the metal gate electrode before the high thermal budget for junction activation, source/drain activation and/or silicidation). In a gate-first approach a DyO capping layer of about 1 nm will typically induce a (positive) shift the threshold voltage of about 150 mV towards N-type threshold voltage workfunction. As comparison different shifts of the threshold voltage induced by using an AlO capping layer with different thicknesses are shown in FIG. 3. For an AlO capping layer of about 0.5 nm or 1.5 nm, a threshold voltage shift towards P-type of about −60 mV is measured. For an AlO capping layer of 1 nm, the threshold voltage shift is somewhat smaller, about −50 mV. AlO (a dielectric with more electronegative atoms (compared to for example a gate host dielectric layer comprising Hf) typically shifts the threshold voltage towards P-type threshold voltage workfunction. It can be seen that using DyO as dielectric capping layer the shift of the threshold voltage is larger compared to the shift induced by an AlO dielectric capping layer.

After the formation of the metal gate electrode material (i.e. the first gate electrode material 115a and the second gate electrode material 115b), further tuning of one of the workfunctions is necessary in order to manufacture a first semiconductor transistor with a first effective workfunction suitable for one dopant type (f.e. PMOS) and a second semiconductor transistor with a second effective workfunction suitable for the opposite dopant type (f.e NMOS). The first gate electrode material 115a is the same as the second gate electrode material 115b.

In a following process a heat sensitive layer 116 is provided on the first metal gate electrode material 115a in the first region 101 (FIG. 1G), i.e. the region for which the effective workfunction is suitable. The heat sensitive layer 116 may be a heat reflective layer or may be a heat absorbing layer. In case of a heat reflective layer, heat (coming from a source 119) that is targeted on the heat reflective layer will at least partially be, more preferably completely reflected back such that heat cannot penetrate through the heat reflective layer down to the underlying metal gate electrode material. In case of a heat absorbing layer, heat that is targeted on the heat absorbing layer will at least partially, more preferably completely be absorbed by/in this heat absorbing layer, such that heat will not penetrate through the heat absorption layer down to the underlying metal gate electrode material. This means the first gate stack 131, i.e. the first metal gate electrode material 115a and the first dielectric capping layer 114a in the first region 101, which is covered by the heat sensitive layer 116 will not be subjected and thus not be influenced by the heat. The second gate stack 132, i.e. the second metal gate electrode material 115b and the second dielectric capping layer 114b in the second region 102, will be subjected and possibly influenced by the heat source 119 as no barrier layer (i.e. heat sensitive layer) is present. With heat source is meant a source from which heat is generated. Due to the generation of heat the targeted regions will undergo a thermal budget. The heat (a thermal budget) is provided in a following process. Otherwise the if a thermal budget is applied to the semiconductor device, a first thermal budget 118a and a second thermal budget 118b may be defined. The first thermal budget 118a and the second thermal budget 118b are provided simultaneously. A first thermal budget 118a is (part of) the total thermal budget that will influence the first transistor 107, otherwise the that will influence the effective work function of the first gate stack 131, otherwise the that will influence the first dielectric capping layer 114a and thereby the first metal gate electrode 115a. A second thermal budget is (part of) the thermal budget that will influence the second transistor 108, otherwise the that will influence the effective work function of the second gate stack 132, otherwise the that will influence the second dielectric capping layer 114b and thereby the second metal gate electrode 115b. Due to the presence of the heat sensitive layer 116 above the first transistor 107, more specifically above the first gate stack 131, more specifically above the first dielectric capping layer 114a and the first metal gate electrode 115a, the first thermal budget 118a will be lower than the second thermal budget 118b.

The heat sensitive layer 116 is patterned to provide portions (e.g. at the second region 102) which transmits radiation from the heat source 119 and to provide portions (e.g. at the first region 101) which blocks (i.e. absorbs or reflects) radiation form the heat source 119.

The heat sensitive layer 116 may comprise any material with a high reflectivity or absorption to laser energy. The (reflective) heat sensitive layer 116 may comprise aluminum.

After the formation of the heat sensitive layer 116 a thermal annealing process is performed (otherwise the a thermal budget is applied) thereby inducing a shift in the second effective workfunction $WF2_{eff}$ of the second gate stack 132 in the second region 102 and a shift of the effective workfunction $WF1_{eff}$ of the first gate stack 131 in the first region 101. Whereas $WF1_{eff}$ and $WF2_{eff}$ are equal before applying the thermal annealing process (the first thermal budget 118a and the second thermal budget 118b), $WF1_{eff}$ and $WF2_{eff}$ become different after applying the thermal annealing process (the first thermal budget 118a and the second thermal budget 118b) using the heat sensitive layer 116 in the first region 101. The first effective workfunction $WF1_{eff}$ of the first gate stack 131 is tuned to a final first workfunction $WF1_{eff\text{-}final}$ of the first gate stack 131 and the second effective workfunction $WF2_{eff}$ of the second gate stack 132 is tuned to a final second workfunction $WF2_{eff\text{-}final}$ of the second gate stack 132, whereby the first effective workfunction $WF1_{eff}$ of the first gate stack 131 is equal to the second effective workfunction $WF2_{eff}$ of the second gate stack 132 (before applying the first and second thermal budget) and whereby the final first workfunction $WF1_{eff\text{-}final}$ of the first gate stack 131 is different from the final second workfunction $WF2_{eff\text{-}final}$ of the second gate stack 132 (after applying the first and second thermal budget).

According to an embodiment of the present invention the difference between the final first workfunction $WF1_{eff\text{-}final}$ and the first effective workfunction $WF1_{eff}$ divided by the difference between the final second workfunction $WF2_{eff\text{-}final}$ and the second effective workfunction $WF2_{eff}$ is preferably smaller or equal to about 0.1:

$$\frac{(WF1_{eff\text{-}final} - WF1_{eff})}{(WF2_{eff\text{-}final} - WF2_{eff})} \leq 0.1 \tag{1}$$

If the first effective workfunction $WF1_{eff}$ shifts towards a negative value (i.e. for PMOS) and the second effective workfunction $WF2_{eff}$ shifts towards a positive value (i.e. for NMOS), formula (1) is always met, otherwise the difference between the final first workfunction $WF1_{eff\text{-}final}$ and the first effective workfunction $WF1_{eff}$ divided by the difference between the final second workfunction $WF2_{eff\text{-}final}$ and the second effective workfunction $WF2_{eff}$ is a negative value and thus smaller or equal to 0.1. If both the first effective workfunction $WF1_{eff}$ and the second effective workfunction $WF2_{eff}$ shift towards a positive or a negative value, the shift of the first effective workfunction $WF1_{eff}$ may only be 0.1 of the shift of the second effective workfunction $WF2_{eff}$.

For example a HfSiON—DyO—TiN gate stack may be used for both the first and the second region. By applying a heat sensitive layer on the first region before applying a thermal budget process to the semiconductor device, the first thermal budget received by the first gate stack (comprising HfSiON—DyO—TiN) will be lower than the second thermal budget receive by the second gate stack (comprising HfSiON—DyO—TiN), since the heat sensitive layer is blocking at least part of the heat in the first region. DyO will influence the effective workfunction of the gate stack. For the first gate stack, due to the low thermal budget, the threshold voltage Vt will shift towards P-type (i.e. a shift of the effective workfunction towards the valence band), whereas for the second gate stack, due to the high thermal budget, the threshold voltage Vt will shift towards N-type (i.e. a shift of the effective workfunction towards the conduction band). Although using a single metal, single dielectric for both PMOS and NMOS transistor, the first effective workfunction $W1_{eff}$ and the second effective workfunction $W2_{eff}$ may be tuned such that after applying a thermal budget the first final effective workfunction $W1_{eff\text{-}final}$ is suitable for PMOS and the second final effective workfunction $W2_{eff\text{-}final}$ is suitable for NMOS. It is an advantage of certain embodiments that a dual workfunction semiconductor device may be formed using a single metal gate electrode and a single metal dielectric for both NMOS and PMOS.

The first effective workfunction $W1_{eff}$ is tuned to a first final effective workfunction $W1_{eff\text{-}final}$ and the second effective workfunction $W2_{eff}$ is tuned to a second final effective workfunction $W2_{eff\text{-}final}$ after applying the thermal budget, i.e the first thermal budget 118a to the first gate stack and the second thermal budget 118b to the second gate stack. The first thermal budget 118a is lower than the second thermal budget 118b due to the use of the heat sensitive layer in the first region. In the first region the effective workfunction is thus tuned as if a gate-last approach is used (metal gate and dielectric capping layer are not subjected to high thermal budgets) and in the second region the effective workfunction is tuned as if a gate-first approach is used (metal gate and dielectric capping layer are provided using a gate-last approach, but metal gate and dielectric capping layer are subjected to a high thermal budget typically used in a gate-first approach or preferably to a thermal budget which is higher than the thermal budget applied in the first region). The first thermal budget 118a applied to the first gate stack 131 is smaller than the thermal budget 118b applied to the second gate stack 132.

The thermal budget 118a, 118b is preferably applied by a laser thermal process. Advantages of using a laser thermal process are the short laser pulses used, only a few nanoseconds which is approximately 8 orders of magnitude shorter than a rapid thermal process. The thermal diffusion with laser annealing is almost negligible. Laser annealing may also provide selective local heating of specific regions without adding thermal budget to existing implants. The temperature used in the laser annealing process is preferably in higher than 800 degrees Celsius. The thermal budget applied in the first region will be smaller than the thermal budget applied in the second region as the heat sensitive layer will block at least partially part of, more preferably all of the applied thermal budget.

Figure 1H:
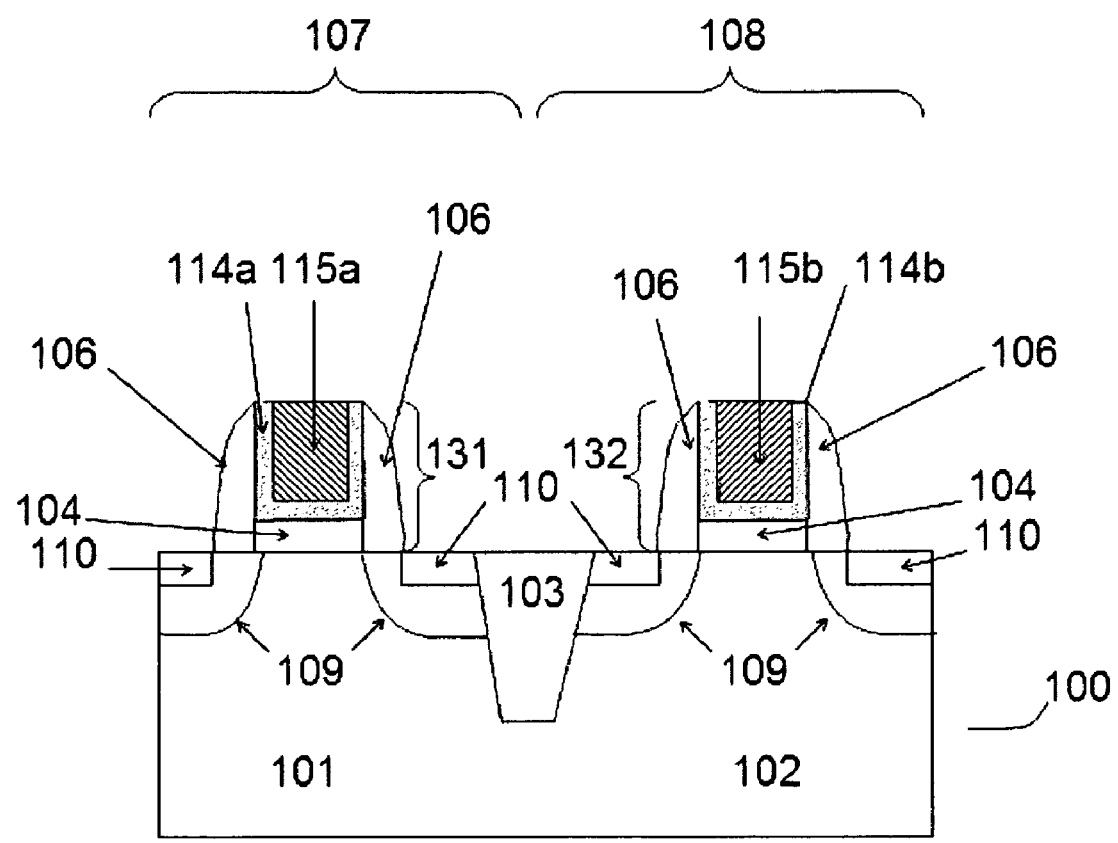

FIG. 1H gives a schematic representation of a dual workfunction semiconductor device manufactured using process described according to embodiments of the present invention. After removing the heat sensitive layer and the heat source, the dual workfunction semiconductor device comprises a first transistor 107 and a second transistor 108, the first transistor 107 and the second transistor 108 comprising a first metal gate stack 131 and a second metal gate stack 132, the first and second metal gate stack comprising the same dielectric layer and metal gate electrode layer, the first transistor 107 having a first final effective workfunction $W1_{eff-final}$ and the second transistor 108 having a second final effective workfunction $W2_{eff-final}$, which is different from the first final effective workfunction $W1_{eff-final}$.

With reference now to FIG. 2A to FIG. 2H different process steps for manufacturing a dual workfunction semiconductor device according to certain embodiments of the present invention is described in more detail wherein a gate-last approach is used for manufacturing the first semiconductor transistor and wherein a gate-first approach is used for manufacturing the second semiconductor transistor. Further in the text process related to FIG. 2A to FIG. 2H will also be referred to process of the gate-last/gate-first (GL/GF) approach.

Figure 2A:
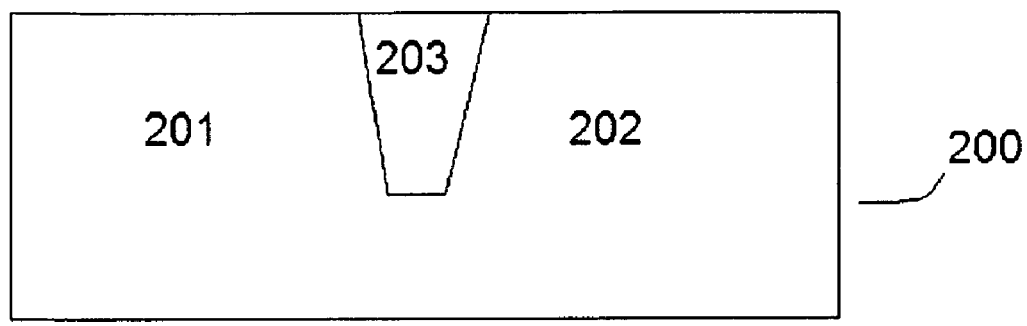
FIGS. 2A-2H show a schematic representation of different process steps for manufacturing a dual workfunction semiconductor device according to a gate-last/gate-first approach as described in certain embodiments of the invention.

FIG. 2A illustrates a semiconductor substrate 200, e.g. a silicon substrate. The substrate 200 may comprise multiple distinct regions. Most preferably two distinct regions may be defined in the substrate 200, as is illustrated in FIG. 2A: a first region 201 and a second region 202. The first region 201 may also be referred as the first active region of the device and the second region 202 may also be referred as the second active region of the device. The first region 201 and the second region 202 may be electrically isolated from each other by an insulating region 203. A possible way to isolate the first 201 and second 202 region from each other is by using shallow trench isolation (STI) in between. STI is a deep narrow trench, filled with oxide, etched into the semiconductor substrate in between adjacent devices in an integrated circuit to provide electrical isolation between. Alternatively, local oxidation of silicon (LOCOS) may be used.

The first transistor will be formed in the first region 201, the first transistor being for example a PMOS transistor (and thus the first region 201 representing a PMOS region for forming a PMOS transistor). The second transistor will be formed in the second region 202, the second transistor begin for example a NMOS transistor (and thus the second region 202 representing a NMOS region for forming a NMOS transistor). It should be understood that the invention is not limited thereto and NMOS and PMOS may be interchanged, i.e forming a first NMOS transistor in the first (NMOS) region and a second PMOS transistor in the second (PMOS) region.

Figure 2B:
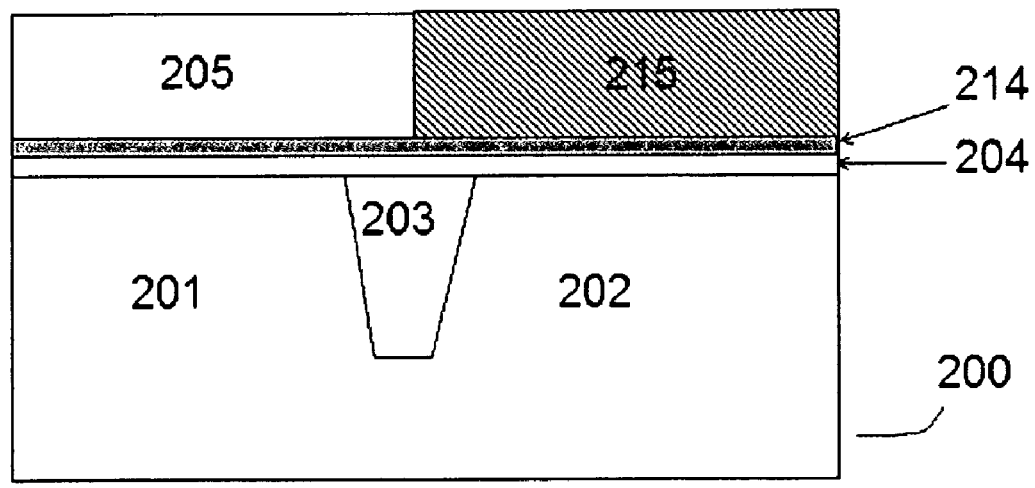
Figure 2C:
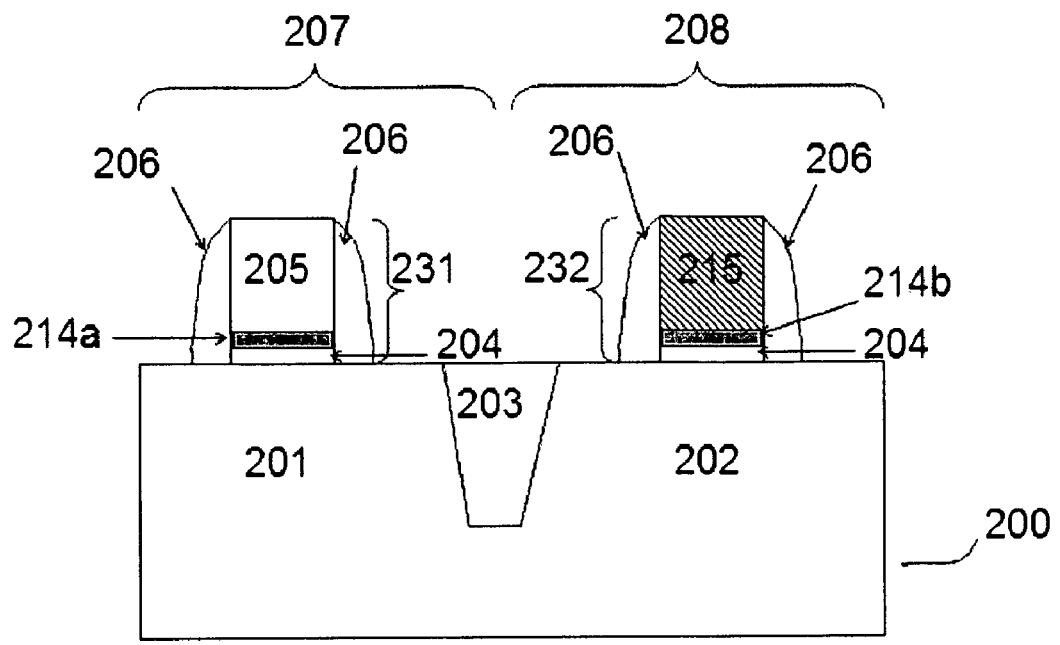

After providing a first region 201 and a second region 202 a gate dielectric host layer 204 is provided on the substrate 200 (FIG. 2B). The gate dielectric host layer 204 may be provided using conventional process steps, materials and equipment for a person skilled in the art in both the first region 201 and second region 202. The dielectric layer 204 may be a layer of insulating material, such as for example silicon dioxide ($SiO_2$), silicon nitride (SiN) or silicon oxynitride ($Si_xO_yN_{1-x-y}$) or more preferably any high-k dielectric material (i.e. k>3.9) such as for example $HfO_2$, $TaO_x$, $Al_2O_y$, or any combination made thereof. The gate dielectric host layer 204 may be formed by thermal oxidation, atomic layer deposition (ALD) or chemical vapor deposition (CVD) or physical vapor deposition (PVD), or any other suitable method known to a person skilled in the art. The gate dielectric host layer 204 may comprise a stack of dielectric materials, such as for example a high-k material (e.g. $HfO_2$) formed on top of an (optional) interfacial dielectric layer (e.g. $SiO_2$—not shown) between the substrate 200 and high-k material. In one embodiment, the gate dielectric host layer 204 may have a thickness in the range of about 0.5 nm to 4 nm.

After providing the gate dielectric host layer 204 a gate dielectric capping layer 214 may be provided on an in contact with (overlying) the gate dielectric host layer 204 (FIG. 2B) in the first region 201 and the second region 202. Part of the gate dielectric capping layer 214 in the first semiconductor transistor will further be referred to as first gate dielectric capping layer 214a. Part of the gate dielectric capping layer in the second semiconductor transistor will further be referred to as second gate dielectric capping layer 214b. The first 214a and second 214b gate dielectric capping layer comprise the same dielectric material.

The dielectric capping material 214 may comprise any dielectric material suitable for tuning the effective workfunction of a gate stack, i.e. for determining (tuning) the effective workfunction of a first gate stack in the first region 201 and for determining (tuning) the effective workfunction of a second gate stack in the second region 202. The dielectric capping layer 214 may comprise an aluminum-based dielectric or a lanthanide-based dielectric. The dielectric capping layer 214 may comprise LaO(N), AlO(N), AlN, DyO(N), ScO(N), GdO(N), CeO(N), TbO(N), ErO(N), YbO(N) or any combination thereof. Depending on the material of the dielectric capping material 214, the dielectric capping layer 214 may be suitable for tuning the first effective workfunction of the first gate stack of the first transistor towards an NMOS device or towards a PMOS device and for tuning the second effective workfunction of the second gate stack of the second transistor towards a PMOS device or towards a NMOS device respectively. If the dielectric capping layer 214 comprises a material with more electropositive atoms such that the built-in dipole field in the gate dielectric (i.e. stack of gate dielectric host layer 204 and dielectric capping layer 214—e.g. HfSiON—DyO stack) may adapt the threshold voltage of the NMOS device independently of the workfunction of the metal gate (e.g. TiN). The DyO layer will thus determine the effective workfunction, which is suitable for an NMOS transistor. If the dielectric capping layer 214 comprises a material with more electronegative atoms such that the built-in dipole field in the dielectric (e.g. HfSiON—AlO stack) may adapt the threshold voltage of the PMOS device independently of the workfunction of the metal gate (e.g. TiN). The AlO layer will thus determine the effective workfunction, which is suitable for a PMOS transistor.

In one embodiment, the dielectric capping layer 214 may have an equivalent oxide thickness (EOT) in the range of about 0.2 nm to 2 nm more preferably in the range of about 0.2 nm to 1 nm and even more preferably in the range of about 0.2 nm to 0.5 nm.

The dielectric capping layer 214 is formed by using any suitable deposition technique such as ALD, PVD, CVD.

For the GL/GF approach, part of the dielectric capping layer 214 may be removed such that the dielectric capping layer 214 is only present on the gate dielectric host layer 204 in the second region 202. Thus only the second gate dielectric capping layer 214b remains present. The first gate dielectric capping layer 214a is removed. The dielectric capping layer overlying part of the gate dielectric host layer 204 in the first region may be removed by a suitable etching process selective to the underlying gate dielectric host layer 204 as commonly known for a person skilled in the art. Removing part of the gate dielectric capping layer 214 may preferably be done before the process of providing a first gate electrode material 205.

After providing the gate dielectric host layer 204, or—if a gate dielectric capping layer 214a, 214b is provided—after providing the gate dielectric capping layer 214, a first gate electrode material 205 and a second metal gate electrode material 215 is provided (FIG. 2B). This may be done using techniques known for a person skilled in the art, such as CVD, ALD, PVD.

For the first region 201 preferably a dummy gate electrode material 205 (e.g. polysilicon material) may be provided (since in the first region 201 the first transistor is manufactured using a gate-last approach). For the second region 202 preferably a metal gate electrode material 215 (further also referred to as second metal gate electrode material 215b) is provided (since in the second region 202 the second transistor is manufactured using a gate-first approach).

Using patterning techniques well-known for a person skilled in the art, the dummy gate electrode material 205 may be formed on and in contact with the underlying dielectric capping layer 214 and/or the underlying gate dielectric host layer 204 in the first 201 and second 202 region, followed by removing (etching) part of the dummy gate electrode material 205 in the second region 202, such that the dummy gate electrode material 205 is only present in de first region 201. In a further process, the second metal gate electrode material 215b may be provided on and in contact with the underlying dielectric capping layer 214b in the second region 202 (FIG. 2B).

In further process steps, in the first region 201 a first (dummy) gate stack 231 is provided and in the second region 202 a second gate stack 232 is provided (FIG. 2C) using patterning techniques well-known for a person skilled in the art. The second gate stack 232 comprises a second gate dielectric capping layer 214b and a second metal gate electrode layer 215b. The second gate stack 232 has a second effective workfunction $WF2_{eff}$ which is determined by the second gate dielectric capping layer 214b. The first gate stack 231 may comprise a first gate dielectric capping layer 214a, comprising the same dielectric material as the second dielectric capping layer 214b and a dummy gate electrode 205. The dummy gate electrode material comprises a material which can be easily removed using a gate-last approach. The dummy gate electrode 205 comprises preferably polysilicon.

The second metal gate electrode 215b comprises a metal comprising material to form a metal gate. With metal comprising material is understood metals, metal alloys, metal silicides, conductive metal nitrides, conductive metal oxides, . . . . Depending on the metal, the workfunction WF of the metal gate electrode may be similar to the workfunction of a conventional p-type doped semiconductor or to the workfunction of a conventional n-type doped semiconductor. For example nickel (Ni), ruthenium oxide (RuO), and molybdenum nitride (MoN) have a workfunction similar to a p-type doped semiconductor material. For example ruthenium (Ru), zirconium (Zr), niobium (Nb), tantalum (Ta), titanium silicide ($TiSi_2$) have a workfunction similar to a n-type doped semiconductor material.

For example a second metal gate electrode material 215b may be formed having a (as-deposited) workfunction which is suitable for forming a NMOS gate electrode in the second region 202, but which is not suitable for forming a PMOS gate electrode in the second region 202. With suitable for forming a NMOS gate electrode is meant that the workfunction may be approximately 4.1 eV (+/− about 0.3 eV). Or vice versa a metal gate electrode material 215b may be formed having a (as-deposited) workfunction which is suitable for forming a PMOS gate electrode in the second region 201, but which is not suitable for forming a NMOS gate electrode in the second region 202. With suitable for forming a PMOS gate electrode is meant that the workfunction may be approximately 5.2 eV (+/− about 0.3 eV).

Figure 2D:
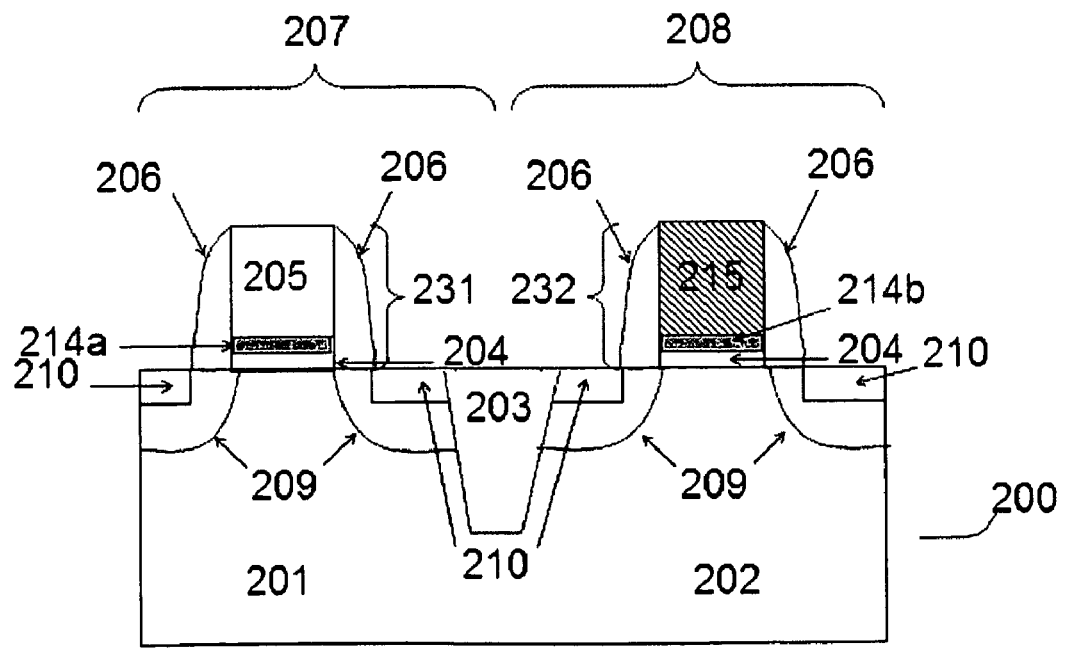
Figure 2E:
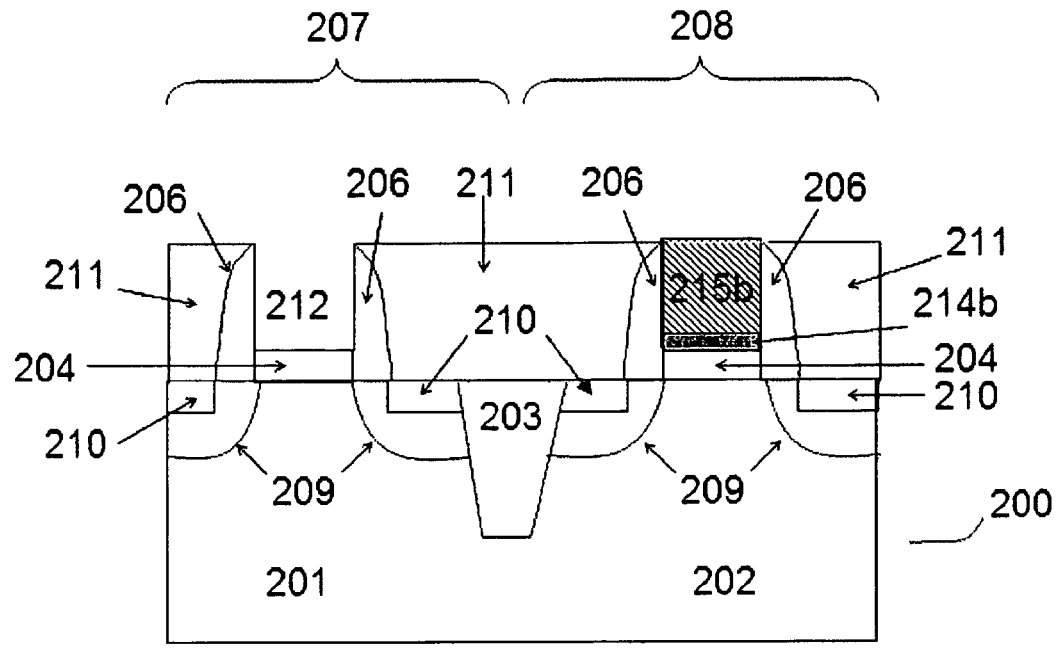
Figure 2F:
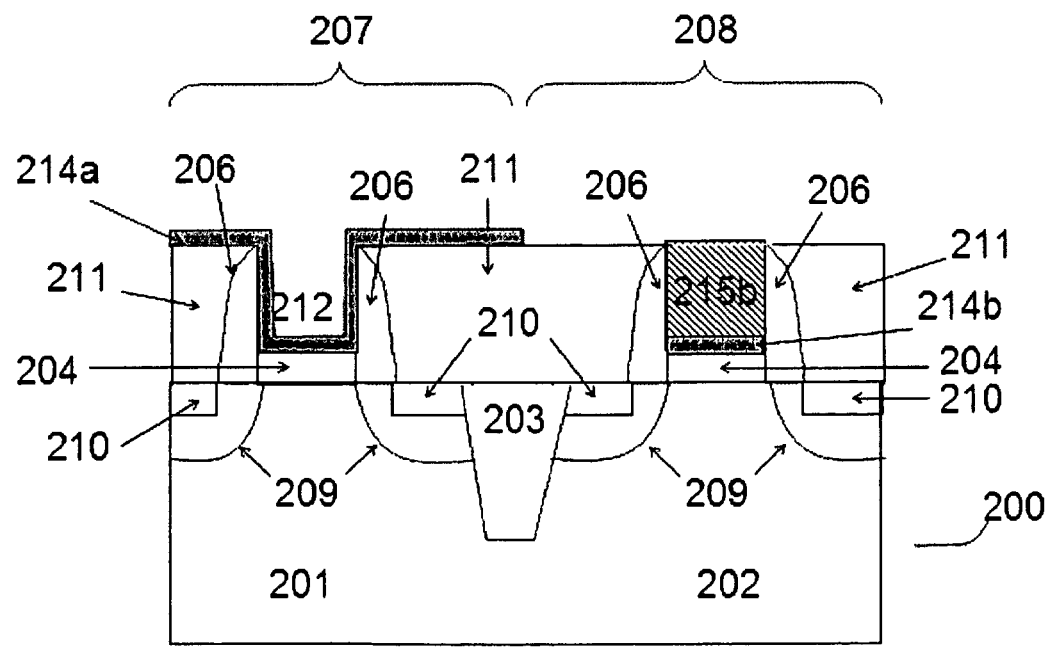

Conventional process steps, materials and equipment may be used to generate a device as schematically shown in FIG. 2D, i.e. process steps comprising patterning (e.g. using conventional lithography) the gate host dielectric layer 204 and the dummy gate electrode layer 205 to form a first (dummy) gate stack 231 in the first region 201 and a second metal gate stack 232 in the second region 202, providing spacers 206 aside of the first and second gate stack 231, 232, formation of the source/drain regions (extension regions/junction regions) 209 in the first region 201 and in the second region 202 and additional silicidation 210. For the activation of the source/drain regions 209 and as well for the formation of the silicided regions 210 in the source/drain regions 209 an annealing process is necessary. This annealing process comprises a high temperature process. This is a high thermal budget process. The temperature of the annealing process is typically higher than about 800 degrees Celsius, preferably in the range of about 800 degrees Celsius to 1200 degrees Celsius. Spike annealing or rapid thermal annealing (RTA) may be used.

The spacers 206 preferably comprise an insulating material such as for example silicon dioxide ($SiO_2$), silicon nitride (SiN) or silicon oxynitride (SiON). Spacers may be deposited by ALD or CVD and patterned by anisotropic etching, or any other suitable method known to a person skilled in the art.

In a next process (FIG. 2E), the dummy gate electrode material 205 in the first gate stack 231 is removed. After removing the dummy gate electrode material 205, e.g. the polysilicon gate electrode material, the underlying gate dielectric host layer 204 is exposed in the first region 201. The removal of the dummy gate electrode material 205 may be done using an etching process which is selective towards the underlying gate dielectric host material 204. More specifically first a dielectric layer 211 may be formed. The formation of the dielectric layer 211 may be done for example by depositing the dielectric layer 211 using CVD, followed by polishing back (e.g. using CMP) the dielectric layer 211 to expose the dummy gate electrode material 205 in the first region 201. The dielectric layer 211 forms a protective layer for protecting the underlying source/drain regions 209 and silicide regions 210 and spacers 206 during the subsequent etching process for removing the dummy gate electrode material 205.

Alternatively (not shown) a protective dielectric liner may be formed protecting the source/drain regions 209 and silicide regions 210 and spacers 206. Using a CMP-less hardmask opening process, the dummy gate electrode material 205 may be removed. After removing the dummy gate electrode material 205 a first trench 212 in the first region 201 is formed in between the sidewall spacers 206. After removal of the dummy gate electrode material 205, the gate dielectric host layer 204 is still present in the first gate stack 231. The dummy gate electrode material 205 however is not present anymore in the first gate stack 231. If the first dielectric capping layer 214a was not removed in any of the previous process steps, the dielectric capping layer 214a may be removed together with the removal of the dummy gate electrode material 205. Although it is not straightforward to perform a selective etching removal towards the first dielectric capping layer 214a, one may also only remove the dummy gate electrode material 205, such that the underlying first dielectric capping layer 214a is exposed (not shown). The second gate stack 232 remains unchanged after the gate electrode material 205 removal process in the first region.

The process of removing the dummy gate electrode material after the junction activation, the source/drain activation, the source/drain silicidation is well known in the so-called gate-last approach or also often referred to replacement gate approach (RPG). The gate-last approach is, to the contrary of a conventional gate-first approach, considered a low-temperature process because the metal gate deposition occurs after the activation anneals (i.e. junction activation, source/drain activation, silicidation). In a gate-first approach the metal gate is deposited on a high-k gate dielectric prior to the activation anneals, such that the metal gate is exposed to high temperatures (temperatures up to 1100 degrees Celsius or higher), which could be detrimental for the proper working of the device. In a gate-last approach, the metal of the metal gate (which will be provided in a further process after removing the dummy gate electrode material) is thus not exposed to these high temperatures. It is known from the state of the art, such as for example published by Schaeffer et al., J. Vac. Sci. Technol. B, 21(1), p. 11-17 (2003) on the "Physical and electrical properties of metal gate electrodes on HfO$_2$ gate dielectrics", that a shift of the threshold voltage ($V_t$) may occur when the gate stack (high-k gate dielectric and metal gate) is subjected to a high thermal budget (such as for example junction activation, source/drain activation, silicidation) as typically done in a gate-first approach.

If a first dielectric capping layer 214a was not present yet, after removal of the dummy gate electrode layer 205 a first dielectric capping layer 214a may be formed (FIG. 2F), the first dielectric capping layer 214a on and in contact with (overlying) the gate dielectric host layer 204 in the first gat stack 231. The first dielectric capping layer 214a comprises the same dielectric material as the second dielectric capping layer 214b. The first and second dielectric capping layer 214a 214b have the same material composition.

The first dielectric capping material 214a may comprise any dielectric material suitable for tuning the effective workfunction of a gate stack, i.e. for determining (tuning) the effective workfunction of the first gate stack 231.

The first dielectric capping layer 214a preferably has an equivalent oxide thickness (EOT) in the range of about 0.2 nm to 2 nm more preferably in the range of about 0.2 nm to 1 nm and even more preferably in the range of about 0.2 nm to 0.5 nm.

The first dielectric capping layer 214a is formed by using any suitable deposition technique such as ALD, PVD, CVD. Preferably a conformal dielectric capping layer 214a is formed. Part of first the dielectric capping layer 214a may be removed such that the dielectric capping layer is only present on the dielectric layer 204 and at the sidewalls of the trench 212 aside of the spacers 206. The first dielectric capping layer overlying part of the dielectric layer 211 may be removed by an etching process as commonly known for a person skilled in the art (FIG. 2G).

Figure 2G:
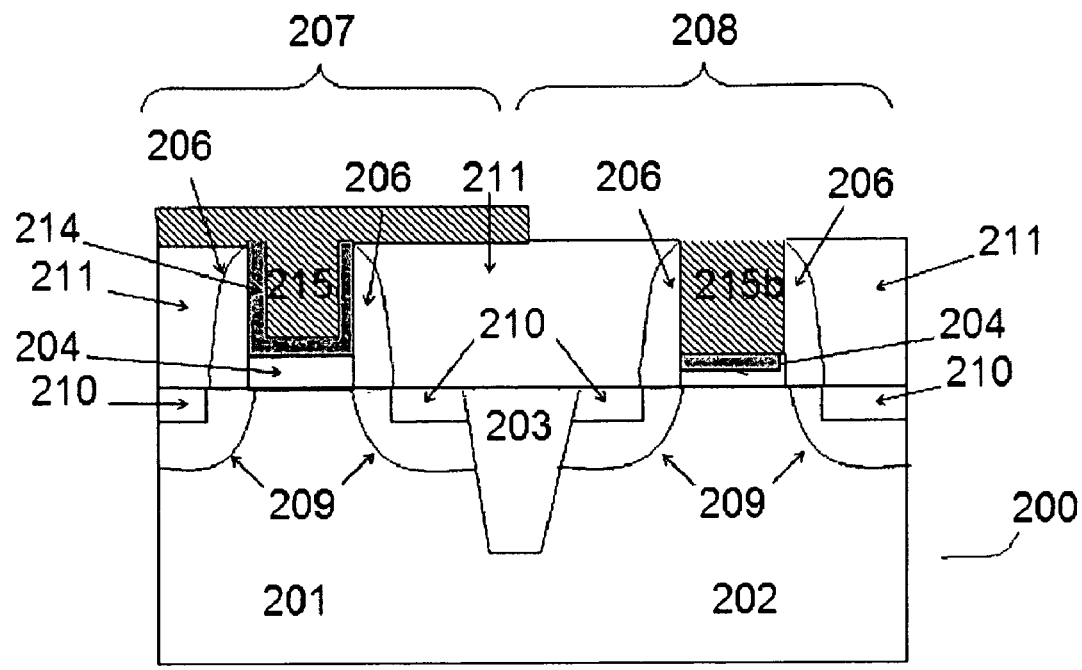

After the formation of the first dielectric capping layer 214a, a first metal gate electrode 215a is formed in the first trench 212 (FIG. 2G). The first metal gate electrode material 215a has a thickness in the range of about 0.5 nm to 10 nm, more preferably in the range of about 5 nm to 10 nm and is deposited using commonly known deposition techniques such as for example ALD, CVD, PVD. The first metal gate electrode material 215a is preferably present in the complete trench 212. The first trench 212 is preferably completely filled with the metal gate electrode material 215a. The first metal gate electrode material/layer 215a comprises the same metal composition as the second and second metal gate electrode material/layer 215b.

Figure 2H:
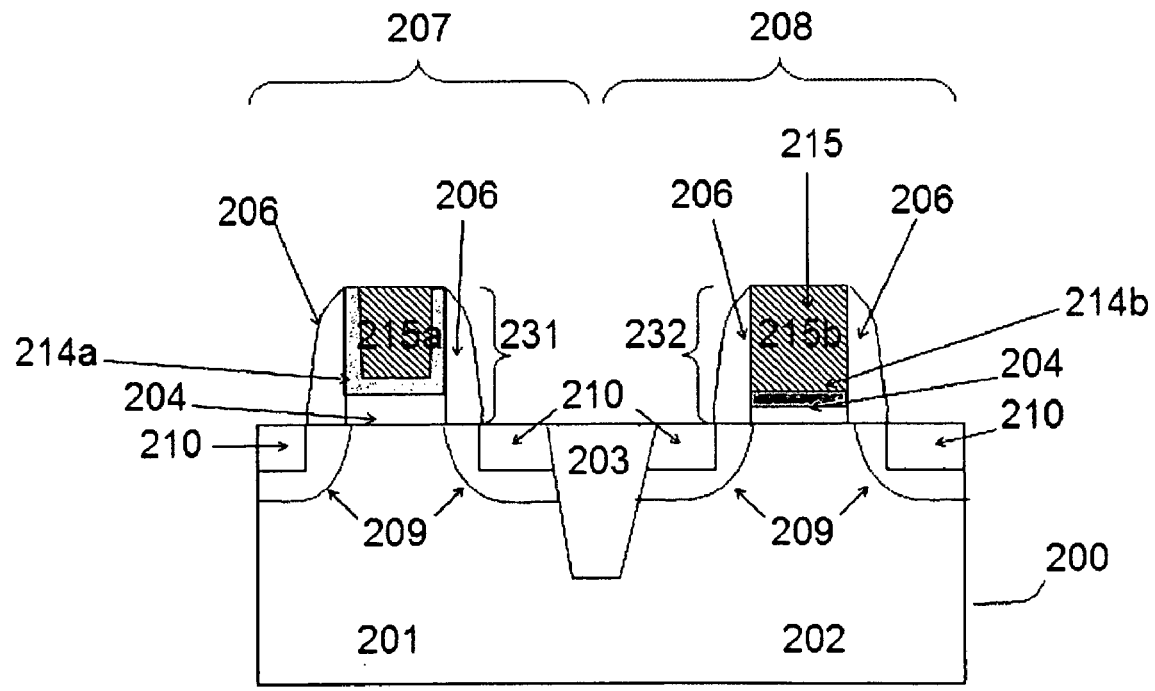

Part of the first metal gate electrode 215a overlying the dielectric layer 211 may be removed. Also the dielectric layer 211 may be removed (FIG. 2H).

At this point in the process flow a semiconductor device is being formed comprising a first 107 and a second 108 transistor both comprising the same materials for the gate stack i.e. the same materials for the dielectric capping layer (first 214a and second 214b) and for the metal gate electrode (first 215a and second 215b).

The (second) metal gate electrode 215 comprises a metal comprising material to form a metal gate. With metal comprising material is understood metals, metal alloys, metal silicides, conductive metal nitrides, conductive metal oxides, . . . . Depending on the metal, the workfunction WF of the metal gate electrode may be similar to the workfunction of a conventional p-type doped semiconductor or to the workfunction of a conventional n-type doped semiconductor. For example nickel (Ni), ruthenium oxide (RuO), and molybdenum nitride (MoN) have a workfunction similar to a p-type doped semiconductor material. For example ruthenium (Ru), zirconium (Zr), niobium (Nb), tantalum (Ta), titanium silicide (TiSi$_2$) have a workfunction similar to a n-type doped semiconductor material.

For example a first metal gate electrode material 215a may be formed having a first (as-deposited) workfunction which is suitable for forming a NMOS gate electrode in the first region 201, but which is not suitable for forming a PMOS gate electrode in the second region 202. With suitable for forming a NMOS gate electrode is meant that the workfunction may be approximately 4.1 eV (+/− about 0.3 eV). Or vice versa a first metal gate electrode material 215a may be formed having a first (as-deposited) workfunction which is suitable for forming a PMOS gate electrode in the first region 201, but which is not suitable for forming a NMOS gate electrode in the second region 202. With suitable for forming a PMOS gate electrode is meant that the workfunction may be approximately 5.2 eV (+/− about 0.3 eV). For the formation of a dual workfunction semiconductor device using one metal gate electrode material for both regions (NMOS and PMOS), the workfunction of the first or/and second metal gate electrode material 215a and/or 215b needs to be tuned/adjusted/modified selectively, i.e. the workfunction of the first or/and second metal gate electrode material 215a and/or 215b needs to be tuned/adjusted/modified in that region for which its (as-deposited) workfunction is not suitable.

The dielectric capping layer 214a, 214b will further determine the effective workfunction of the gate stack. Otherwise the, the first dielectric capping layer 214a located under the first metal gate electrode material 215a in the first gate stack 231 determines a first effective workfunction WF1$_{eff}$ of the first gate stack 231 and the dielectric capping layer 214b located under the second metal gate electrode material 215b in the second gate stack 232 determines a second effective workfunction WF2$_{eff}$ of the second gate stack 232.

At this point in the process flow of formation of the first semiconductor transistor 207 and the second semiconductor transistor 208, both the first gate stack 131 and the second gate stack 132 have been subject to a thermal budget process. However the thermal budget applied to the first gate stack 231 is lower than the thermal budget applied to the second gate stack 232. The second gate stack 232 has been subjected to a high thermal budget process (i.e. to any high temperature process), i.e. a temperature process higher than 800 degrees Celsius, as the second gate stack 232 has been formed using a gate-first approach. The first gate stack 231, which is formed using a gate-last approach, has not been subjected to such a high thermal budget process (i.e. to any high temperature process), i.e. a temperature process higher than 800 degrees Celsius compared to the thermal budget used for the formation of the second gate stack 232. The first thermal budget supplied to the first gate stack 231 is lower than the second thermal budget supplied to the second gate stack 232. Therefore, the first effective workfunction WF1$_{eff}$ of the first gate stack 231 and the second effective workfunction WF2$_{eff}$ of the second gate stack 232 are different since the first gate stack 231 and second 232 gate stack have been subjected to different thermal budgets, more specifically a first thermal budget and a second thermal budget respectively.

It is an advantage of certain embodiments that a dual workfunction semiconductor device may be formed comprising an NMOS and PMOS transistor comprising the same materials for the gate stack, i.e. comprising the same metal gate electrode material and the same dielectric capping layer material.

For example a HfSiON—DyO—TiN gate stack may be used for both the first and the second region. For the first gate stack, due to the low thermal budget (from the gate-last approach), the threshold voltage Vt will shift towards P-type (i.e. a shift of the effective workfunction towards the valence band), whereas for the second gate stack, due to the high thermal budget (from the gate-first approach), the threshold voltage Vt will shift towards N-type (i.e. a shift of the effective workfunction towards the conduction band). Although using a single metal, single dielectric for both PMOS and NMOS transistor, the first effective workfunction W1$_{eff}$ and the second effective workfunction W2$_{eff}$ may be tuned such that after applying a thermal budget the first final effective workfunction W1$_{eff\text{-}final}$ is suitable for PMOS and the second final effective workfunction W2$_{eff\text{-}final}$ is suitable for NMOS.

The first effective workfunction W1$_{eff}$ is tuned to a first final effective workfunction W1$_{eff\text{-}final}$ and the second effective workfunction W2$_{eff}$ is tuned to a second final effective workfunction W2$_{eff\text{-}final}$ after applying a thermal budget, i.e a first thermal budget to the first gate stack and a second thermal budget to the second gate stack. The first thermal budget is lower than the second thermal budget due to the use of a gate-first approach for the manufacturing of the second transistor and a gate-last approach for the manufacturing of the first transistor. The thermal budget applied to the first gate stack is smaller than the thermal budget applied to the second gate stack.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of manufacturing a dual work function semiconductor device comprising:
    manufacturing a first transistor in a first region of a semiconductor substrate, the first transistor comprising a first gate stack having a first effective workfunction (WF1$_{eff}$), the first gate stack comprising a first gate dielectric capping layer and a first metal gate electrode layer on and in contact with the first gate dielectric capping layer,
    the first gate dielectric capping layer determining the first effective workfunction (WF1$_{eff}$);
    manufacturing a second transistor in a second region of the substrate, the second transistor comprising a second gate stack having a second effective workfunction (WF2$_{eff}$), the second gate stack comprising a second gate dielectric capping layer and a second metal gate electrode layer on and in contact with the second gate dielectric capping layer, the second metal gate electrode layer being formed from the same metal composition as the first metal gate electrode layer, the second gate dielectric capping layer being formed from the same dielectric material as the first dielectric capping layer, the second gate dielectric capping layer determining the second effective work function (WF2$_{eff}$) being the same as the first effective workfunction (WF1$_{eff}$); and
    applying a first thermal budget to at least the first gate dielectric capping layer and a second thermal budget to at least the second gate dielectric capping material, the first thermal budget being smaller than the second thermal budget such that the first effective workfunction (WF1$_{eff}$) is modified into a final first effective workfunction (WF1$_{eff\text{-}final}$) and such that the second effective workfunction (WF2$_{eff}$) is modified into a final second effective workfunction (WF2$_{eff\text{-}final}$), wherein the final first effective workfunction (WF1$_{eff\text{-}final}$) is different from the final second effective work function (WF2$_{eff\text{-}final}$).

2. The method of forming a dual workfunction semiconductor device according to claim 1, wherein $$\frac{(WF1_{eff\text{-}final} - WF1_{eff})}{(WF2_{eff\text{-}final} - WF2_{eff})} \leq 0.1$$

with WF1$_{eff}$ being the first effective workfunction, WF2$_{eff}$ being the second effective workfunction WF1$_{eff\text{-}final}$ being the final first effective workfunction, WF2$_{eff\text{-}final}$ being the final second effective workfunction.

3. The method of forming a dual workfunction semiconductor device according to claim 2, wherein the final first effective workfunction (WF1$_{eff\text{-}final}$) is substantially equal to the first effective work function (WF1$_{eff}$).

4. The method of forming a dual workfunction semiconductor device according to claim 1, wherein one of the first or the second transistor is a PMOS transistor and wherein the other one of the first or the second transistor is a NMOS transistor.

5. The method of forming a dual workfunction semiconductor device according to claim 1, wherein the manufacturing of the first transistor is done using a gate-last approach.

6. The method of forming a dual workfunction semiconductor device according to claim 1, wherein the first thermal budget is at a temperature lower than about 800 degrees Celsius.

7. The method of forming a dual workfunction semiconductor device according to claim 1, wherein the manufacturing of the first transistor further comprises:
   forming a first dummy gate stack in the first region, the first dummy gate stack comprising a polysilicon gate electrode layer on and in contact with a first gate dielectric host layer;
   forming a source/drain region;
   removing the polysilicon gate electrode thereby exposing the underlying first gate dielectric host layer;
   forming the first gate dielectric capping layer on and in contact with the first gate dielectric host layer; and
   forming the first metal gate electrode layer overlying the first gate dielectric capping layer.

8. The method of forming a dual workfunction semiconductor device according to claim 1, wherein the manufacturing of the second transistor is done using a gate-last approach.

9. The method of forming a dual workfunction semiconductor device according to claim 8, wherein the manufacturing of the second transistor further comprises:
   forming a second dummy gate stack in the second region, the second dummy gate stack comprising a polysilicon gate electrode layer overlying a second gate dielectric host material;
   forming a source/drain region; removing the polysilicon gate electrode thereby exposing the underlying second gate dielectric host layer;
   forming the second gate dielectric capping layer on and in contact with the second gate dielectric host layer; and
   forming the second metal gate electrode layer on and in contact with the second gate dielectric capping layer.

10. The method of forming a dual workfunction semiconductor device according to claim 8, wherein the process of applying a first thermal budget to the first gate dielectric capping layer and a second thermal budget to the second gate dielectric capping layer further comprises:
   providing a heat sensitive layer on the first region after the process of forming the second metal gate electrode layer; and
   performing a thermal annealing process of the first region and the second region simultaneously, such that the heat sensitive layer blocks at least part of the temperature resulting in a first thermal budget being smaller than the second thermal budget; removing the heat sensitive layer.

11. The method of forming a dual workfunction semiconductor device according to claim 10, wherein the heat sensitive layer is a heat reflection layer.

12. The method of forming a dual workfunction semiconductor device according to claim 10, wherein the heat sensitive layer comprises aluminum.

13. The method of forming a dual workfunction semiconductor device according to claim 10, wherein the heat sensitive layer is a heat absorption layer.

14. The method of forming a dual workfunction semiconductor device according to claim 10, wherein the thermal annealing process comprises a laser anneal.

15. The method of forming a dual workfunction semiconductor device according to claim 1, wherein the first dielectric capping layer and the second dielectric capping layer comprise a lanthanide-based dielectric material.

16. The method of forming a dual workfunction semiconductor device according to claim 1, wherein the first dielectric capping layer and the second dielectric capping layer comprise an aluminum-based dielectric material.

17. A dual workfunction semiconductor device formed by the method according to claim 1.

* * * * *